US007333733B2

(12) United States Patent
Taylor et al.

(10) Patent No.: US 7,333,733 B2
(45) Date of Patent: Feb. 19, 2008

(54) OPTOELECTRONIC CLOCK GENERATOR PRODUCING HIGH FREQUENCY OPTOELECTRONIC PULSE TRAINS WITH VARIABLE FREQUENCY AND VARIABLE DUTY CYCLE AND LOW JITTER

(75) Inventors: Geoff W. Taylor, Storrs-Mansfield, CT (US); Rohinton Dehmubed, Hamden, CT (US); Daniel C. Upp, Southbury, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 623 days.

(21) Appl. No.: 10/383,364

(22) Filed: Mar. 7, 2003

(65) Prior Publication Data

US 2004/0081467 A1   Apr. 29, 2004

Related U.S. Application Data

(63) Continuation-in-part of application No. 10/280,892, filed on Oct. 25, 2002, now Pat. No. 6,954,473.

(51) Int. Cl.
*H04B 10/00* (2006.01)
(52) U.S. Cl. ...................................... 398/161
(58) Field of Classification Search ................ 398/161, 398/141, 142, 154, 155, 160, 164; 385/24; 372/28, 32, 43
See application file for complete search history.

(56) References Cited

U.S. PATENT DOCUMENTS 3,856,402 A   12/1974  Low et al. .................... 356/5

| 3,919,656 A | 11/1975 | Sokal et al. | .................. 330/51 |
| 4,424,525 A | 1/1984 | Mimura | ....................... 357/23 |
| 4,658,403 A | 4/1987 | Takiguchi et al. | ............ 372/96 |
| 4,683,484 A | 7/1987 | Derkits, Jr. | ................... 357/16 |

(Continued)

OTHER PUBLICATIONS

*10-Gb/s High-Speed Monolithically Integrated Photoreceiver Using InGaAs p-l-n PD and Planar Doped InAlAs/InGaAs HEMT's* by Y. Akahori et al., IEEE Photonics Technology Letters, vol. 4, No. 7, Jul. 1992.

(Continued)

*Primary Examiner*—Jason Chan
*Assistant Examiner*—Quan-Zhen Wang
(74) *Attorney, Agent, or Firm*—Gordon & Jacobson, PC

(57) ABSTRACT

An optoelectronic pulse generator is provided that includes a thyristor detector/emitter device having an input port and an output port. The thyristor detector/emitter device is adapted to detect an input optical pulse supplied to the input port and to produce an output optical pulse (via laser emission) and an output electrical pulse in response to the detected input optical pulse. The output optical pulse is output via the output port. An optical feedback path is operably coupled between the output port and the input port of the thyristor detector/emitter device. The optical feedback path supplies a portion of the output optical pulse produced by the thyristor detector/emitter device to the input port, thereby causing the thyristor detector/emitter device to produce a sequence of output optical pulses and a corresponding sequence of output electrical pulses. Preferably, the optical feedback path comprises a programmable optical delay line realized by a network of in-plane waveguide structures and directional coupler devices that are integrally formed with the thyristor device structure of the detector/emitter device.

21 Claims, 17 Drawing Sheets

U.S. PATENT DOCUMENTS

| | | | | |
|---|---|---|---|---|
| 4,806,997 | A | 2/1989 | Simmons et al. | 357/16 |
| 4,814,774 | A | 3/1989 | Herczfeld | 432/372 |
| 4,827,320 | A | 5/1989 | Morkoc et al. | 357/22 |
| 4,829,272 | A | 5/1989 | Kameya | 333/139 |
| 4,899,200 | A | 2/1990 | Shur et al. | 357/30 |
| 4,949,350 | A | 8/1990 | Jewell et al. | 372/45 |
| 5,010,374 | A | 4/1991 | Cooke et al. | 357/16 |
| 5,105,248 | A | 4/1992 | Burke et al. | 357/24 |
| 5,202,896 | A | 4/1993 | Taylor | 372/50 |
| 5,204,871 | A * | 4/1993 | Larkins | 372/45.01 |
| 5,337,328 | A | 8/1994 | Lang et al. | 372/45 |
| 5,386,128 | A | 1/1995 | Fossum et al. | 257/183.1 |
| 5,390,202 | A | 2/1995 | Yan et al. | 372/26 |
| 5,422,501 | A | 6/1995 | Bayraktaroglu | 257/195 |
| 5,436,759 | A | 7/1995 | Dijaili et al. | 359/333 |
| 5,606,572 | A | 2/1997 | Swirhum et al. | 372/96 |
| 5,698,900 | A | 12/1997 | Bozada et al. | 257/744 |
| 5,708,671 | A | 1/1998 | Siao et al. | 372/20 |
| 6,031,243 | A | 2/2000 | Taylor | 257/13 |
| 6,191,878 | B1 | 2/2001 | Spivey et al. | 359/189 |
| 6,512,783 | B1 * | 1/2003 | Yamamoto et al. | 372/45.01 |
| 2002/0067877 | A1 | 6/2002 | Braun et al. | 385/15 |
| 2003/0058495 | A1 * | 3/2003 | Brindel | 359/123 |

OTHER PUBLICATIONS

*10-Gbit/s InP-Based High-Performance Monolithic Photoreceivers Consisting of p-i-n Photodiodes and HEMT's* by Kiyoto Takahata et al., IEICE Trans. Electron., vol. E83-C, No. 6, Jun. 2000.

*10 Ghz Bandwidth Monolithic p-i-n Modulation-Doped Field Effect Transistor Photoreceiver* by N.K. Dutta et al., Appl. Phys. Lett., vol. 63, No. 15, Oct. 11, 1993.

*20 Gbit/s Long Wavelength Monolithic Integrated Photoreceiver Grown on GaAs* by V. Hurm et al., Electronic Letters, vol. 33, No. 7, Mar. 27, 1997.

*Heterojunction Field-Effect Transistor (HFET)* by G.W. Taylor et al., Electronics Letters, vol. 22, No. 15, pp. 784-786, Jul. 17, 1986.

*High Temperature Annealing of Modulatin Doped GaAs/A1GaAs Heterostructures for FET Applications* by H. Lee et al., 1983 IEEE/Cornell Conf. On High-Speed Semiconductor Devices & Ckts, Aug. 1983.

*Monolithic Integrated Optoelectronic Circuits* by M. Berroth et al., 0-7803-2442-0-8/95 IEEE, 1995.

*Submicrometre Gate Length Scaling of Inversion Channel Heterojunction Field Effect Transistor* by P.A. Kiely et al., Electronics Letters, vol. 30, No. 6, Mar. 17, 1994.

*Theoretical and Experimental Results for the Inversion Channel Heterostructure Field Effect Transistor* G.W. Taylor et al., IEE Proceedings-G, vol. 140, No. 6, Dec. 1993.

*Polymer-Based Optical Waveguid Circuits for Photonic Phased Array Antennas* by Suning Tang et al., SPIE vol. 3632, Jan. 1999.

*1.244 Ghz Generic PLL Clock Synthesiser GD 16590*, GiGa, an Intel Commpany, GD16590, Data Sheet Rev.: 13, Jan. 18, 2002.

* cited by examiner

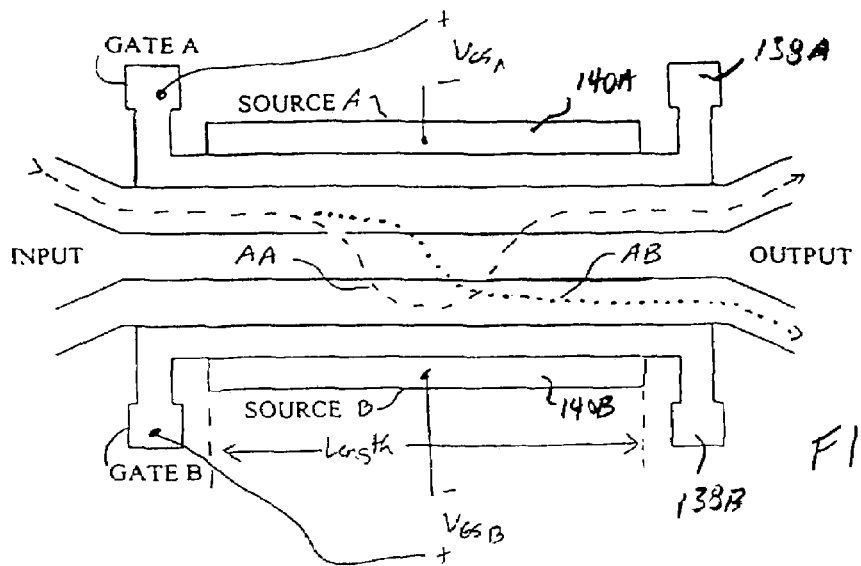
FIG. 7B1
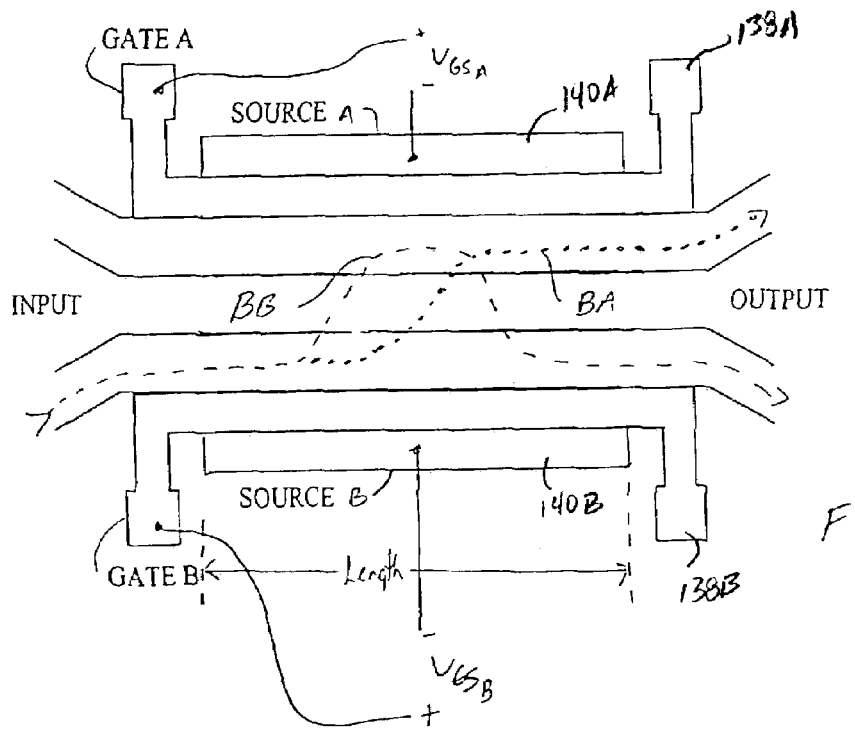
FIG. 7B2

| | Layer Material | Layer Doping Type | Typical Doping Concentration (atoms/cm³) | Typical Layer Thickness (Å) | Layer # |
|---|---|---|---|---|---|
| 130 | InGaAs | P+ | 1E20 | 25 | 1165b |
| 120 { | GaAs | P+ | 1E20 | 75 | 1165a |
| | Al(.7)Ga(.3)As | P | 1E17 | 700 | 1164b |
| | Al(.7)Ga(.3)As | P+ | 1E19 | 10 | 1164a |
| | Al(.15)Ga(.85)As | P+ | 3.5E18 | 25 | 1163d |
| 126 { | Al(.15)Ga(.85)As | | UD | 300 | 1163c |
| | Al(.15)Ga(.85)As | N+ | 3.5E18 | 80 | 1163b |
| | Al(.15)Ga(.85)As | | UD | 30 | 1163a |
| | GaAs | | UD | 15 | 1162 |
| 124 { | In(zo)Ga(80)AsN QW/GaAs QW GaAs Barrier } ×3 | | UD | 60 | 1161 |
| | GaAs | | UD | 100 | 1160b |
| 122 { | Al(.15)Ga(.85)As | | UD | 150 | 1160a |
| | GaAs Barrier In(zo)Ga(80)AsN QW/GaAs QW } ×3 | | UD | 5000 | 1159 |
| 120 { | GaAs | | UD | 100 | 1158 |
| | Al(.15)Ga(.85)As | | UD | 60 | 1157 |
| | Al(.15)Ga(.85)As | | UD | 15 | 1156 |
| 118 { | Al(.15)Ga(.85)As | P+ | 3.5E18 | 30 | 1155d |
| | Al(.15)Ga(.85)As | | UD | 80 | 1155c |
| | Al(.15)Ga(.85)As | | 3.5E18 | 300 | 1155b |
| | Al(.15)Ga(.85)As | N | 1E17 | 80 | 1155a |
| 116 { | Al(.7)Ga(.3)As | N | | 700 | 1154 |
| 114 { | GaAs | N+ | 3.5E18 | 2200 | 1153 |
| | AlAs | | UD | 1701 | 1151 |
| 112 { | GaAs } ×7 | | UD | 696 | 1152 |
| | AlAs | | UD | 1701 | 1151 |
| 110 { | GaAs Substrate | | SI | | 1149 |

FIG. 8A

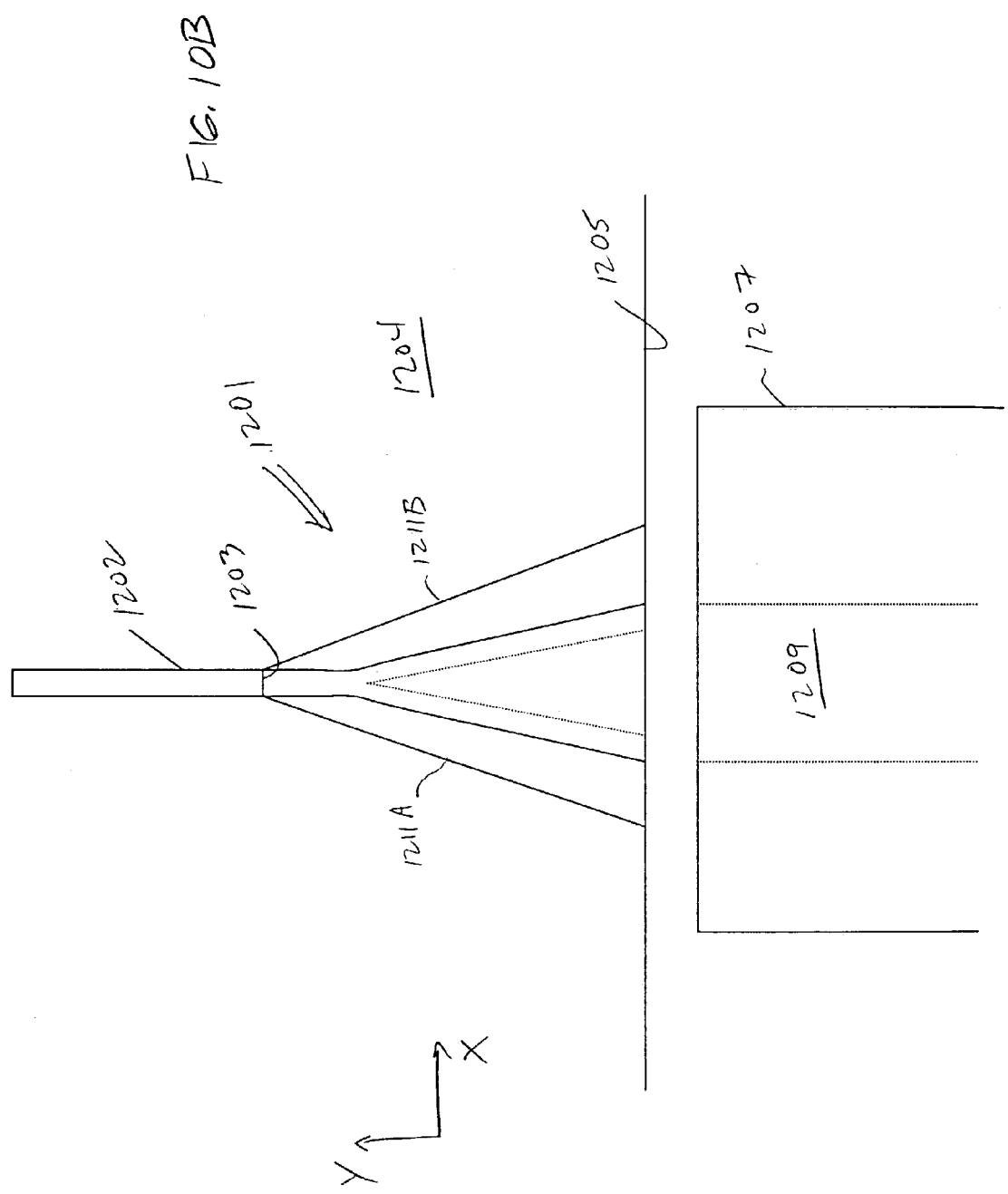

OPTOELECTRONIC CLOCK GENERATOR PRODUCING HIGH FREQUENCY OPTOELECTRONIC PULSE TRAINS WITH VARIABLE FREQUENCY AND VARIABLE DUTY CYCLE AND LOW JITTER

CROSS-REFERENCE TO RELATED APPLICATIONS

The present application is a continuation-in-part of U.S. application Ser. No. 10/280,892, filed on Oct. 25, 2002 now U.S. Pat. No. 6,954,473, entitled "Optoelectronic Device Employing at least one Semiconductor Heterojunction Thyristor for Producing Variable Electrical/Optical Delay," incorporated by reference above in its entirety.

BACKGROUND OF THE INVENTION

1. Field of the Invention

This invention relates to optical and electrical clock generators and to optical and electronic signal processing systems, including digital optical communication systems, based thereon.

2. State of the Art

Communication systems employing digital pulse position modulation techniques have been known for some time as an attractive approach to secure communications with significant potential for very high bandwidth. It is currently being revisited with increased interest for wireless communication systems because of its high channel density with low crosstalk. More particularly, wireless communication systems operate in their specific government-granted section of an increasingly congested radio spectrum. Such congestions leads to unwanted channel interception and infringement, which is problematic particularly in military applications. Digital pulse position modulation addresses this problem by using pulse spacing as the modulation parameter to represent either a logic level "1" or a logic level "0". Each channel from a single source is assigned a unique combination of pulse spacings (as sequence). The pulses are timed according to a unique complex code to represent a logic level "1" or a logic level "0". The unique complex code is shared only by the sender and the intended receiver. The probability of anyone intercepting the signal without the code is near zero. The use of high voltage pulses provides a superb signal to noise ratio upon detection, which simplifies the receiving circuitry.

The heart of such communication systems is a voltage controlled oscillator/frequency synthesizer with a stable pulse width and spacing between pulses. Variations in such pulse width and spacing causes jitter, which limits the performance of the system by limiting the density of channels in the system. Conventional integrated circuit technologies are limited in their ability to create high frequency pulses with minimal jitter. Moreover, the voltage levels of such pulses are limited, and power dissipation is significant. Typically, the voltage controlled oscillator/frequency synthesizer is realized by some form of astable multivibrator implemented in bipolar circuitry. The time delay between pulses is provided by a varying the capacitive loading of the astable multivibrator. In such configurations, the time delay is determined by a trigger point within the astable multivibrator, which is subject to fluctuation due to noise. Reducing this noise level is a major issue in controlling the trigger point of the astable multivibrator. For example, high speed voltage controlled oscillators (such as those based on silicon germanium heterojunction bipolar transistor technology developed by IBM) are capable of switching waveforms with rise and fall times in the range of 0.5 nanoseconds. However, the high voltage levels are small (on the order of 200-400 millivolts) and the power dissipation is significant. Moreover, such devices suffer from pulse delay variability, which introduces unwanted jitter and limits the performance of the system as described above.

High frequency clock sources with low jitter are also important components to optical communication systems. Typically such systems include a high frequency voltage controlled oscillator/frequency synthesizer that generates an electrical oscillating signal having a desired frequency and amplitude level. This electrical oscillating signal is supplied to a high speed laser driver that drives a laser diode to produce an optical clock signal at the desired frequency. The optical power level of the optical clock signal is controlled by the DC level of the electrical signal generated by the laser driver that drives the laser diode. The optical clock signal produced by the laser diode is supplied to a fiber optic line or other waveguide operably coupled to the laser diode. Because such systems rely on frequency synthesis in the electrical domain, they suffer from the same problems as described above (e.g., a limited ability to provide high frequency pulses with minimal jitter).

Moreover, clocks and pulse sources are critical elements in next generation integration circuits such as digital signal processors, microprocessors, analog-to-digital converters, digital-to-analog converters, phased-locked loops and telecommunication receivers and transponders based thereon. In such applications, performance is dependent upon stability and jitter of the clock source(s).

Thus, there remains a need in the art to provide a mechanism that is capable of providing high frequency electrical and/or optical pulses with minimal jitter (e.g., where there is minimal variation of pulse width and spacing between pulses).

In addition, there is a need for such a pulse generation mechanism whereby the frequency and/or the duty cycle of the pulses can be controllably varied. These features enable the pulse frequency and/or pulse duty cycle to be varied, which is advantageous in many different applications. For example, these features can be used to generate carrier signals of varying frequency in wireless communication systems (such those utilizing digital pulse position modulation techniques as described above) and in optical communication systems. They can also be used to generate clocks signals of varying frequency and duty cycle in digital signal processors and microprocessors, which is useful for implementing power saving schemes whereby the frequency and/or duty cycle of the clock signals of the circuit are decreased in a power-saving mode. They are also useful as part of frequency synthesizers in analog-to-digital converters, digital-to-analog converters, and phased-locked loops.

SUMMARY OF THE INVENTION

It is therefore an object of the invention to provide a mechanism that provides accurate and controllable optical/electrical clock signal generation.

It is another object of the invention to provide a mechanism that provides optical/electrical clock signal generation and having lower cost and ease of integration.

It is another object of the invention to provide an optical/electrical clock signal generation mechanism that is formed from a multilayer growth structure that can also be used to build a broad range of devices such as optical emitters, optical detectors, optical modulators, optical amplifiers, transistors, and optical waveguide devices.

It is a further object of the invention to provide an optical/electrical clock signal generation mechanism utilizing a thyristor device in addition to a broad range of devices such as optical modulators, optical amplifiers, transistors, and optical waveguide devices, all of which are formed from a multilayer growth structure.

It is an additional object of the invention to provide an optical/electrical clock signal generation mechanism suitable for high frequency applications.

It is also an object of the invention to provide an optical/electrical clock signal generation mechanism suitable for high frequency applications that require minimal jitter (e.g., where there is minimal variation of pulse width and spacing between pulses).

It is also an object of the invention to provide an optical/electrical clock signal generation mechanism suitable for high frequency applications that require the frequency and/or the duty cycle of the clock signal to be controllably varied.

According to the present invention, an optoelectronic pulse generator is provided that includes a thyristor detector/emitter device having an input port and an output port. The thyristor detector/emitter device is adapted to detect an input optical pulse supplied to the input port and to produce both an output optical pulse (via laser emission) and an output electrical pulse in response to the detected input optical pulse. The output optical pulse is output via the output port. An optical feedback path is operably coupled between the output port and the input port of the thyristor detector/emitter device. The optical feedback path supplies a portion of the output optical pulse produced by the thyristor detector/emitter device to the input port, thereby causing the thyristor detector/emitter device to regeneratively produce a sequence of output optical pulses and a corresponding sequence of output electrical pulses.

According to one embodiment of the present invention, the optical feedback path comprises a programmable optical delay line. Preferably, the programmable optical delay line includes a network of in-plane waveguide structures and directional coupler devices. integrally formed with the thyristor device structure of the detector/emitter device. In such configurations, frequency of the optical clock signal (and corresponding electrical clock signal) produced by the thyristor detector/emitter device is adjusted by controlling the programmable optical delay line to change its optical path length. The duty cycle of such optical clock signal (and corresponding electrical clock signal) may be controlled by varying a bias current level supplied to an injector terminal of the thyristor detector/emitter device, or by modulating optical power of the pulses provided to the input port of the thyristor detector/emitter device.

According to another embodiment of the present invention, a phase lock loop is realized utilizing the optoelectronic pulse generator. The phase lock loop includes a programmable pulse signal generator that produces a reference electrical pulse signal. A phase comparator generates an output signal representing the phase difference between a first clock signal derived from the sequence of output electrical pulses produced by the thyristor detector/emitter device and a second clock signal derived from the reference electrical pulse signal produced by the programmable pulse generator. Control logic controls the programmable optical delay line based upon the output signal generated by the phase comparator in order to minimize the phase differences.

According to other embodiments of the present invention, the thyristor detector/emitter device and the active/passive devices that realize the programmable optical delay line are integrally formed as part of an optoelectronic integrated circuit fabricated from an epitaxial structure.

Additional objects and advantages of the invention will become apparent to those skilled in the art upon reference to the detailed description taken in conjunction with the provided figures.

BRIEF DESCRIPTION OF THE DRAWINGS

FIGS. 7B1 and 7B2 are plan views that illustrate the optical switching operation of the directional coupler device of FIG. 7A.

FIG. 8A is a table illustrating an exemplary inversion quantum-well channel layer structure made with group III-V material from which devices of the optoelectronic integrated circuit of FIG. 1 can be realized.

FIG. 10B is a plan view showing the exemplary in-plane waveguide of FIG. 10A adapted to interface to an optical fiber with minimal insertion loss.

DETAILED DESCRIPTION OF THE PREFERRED EMBODIMENTS

Figure 1:
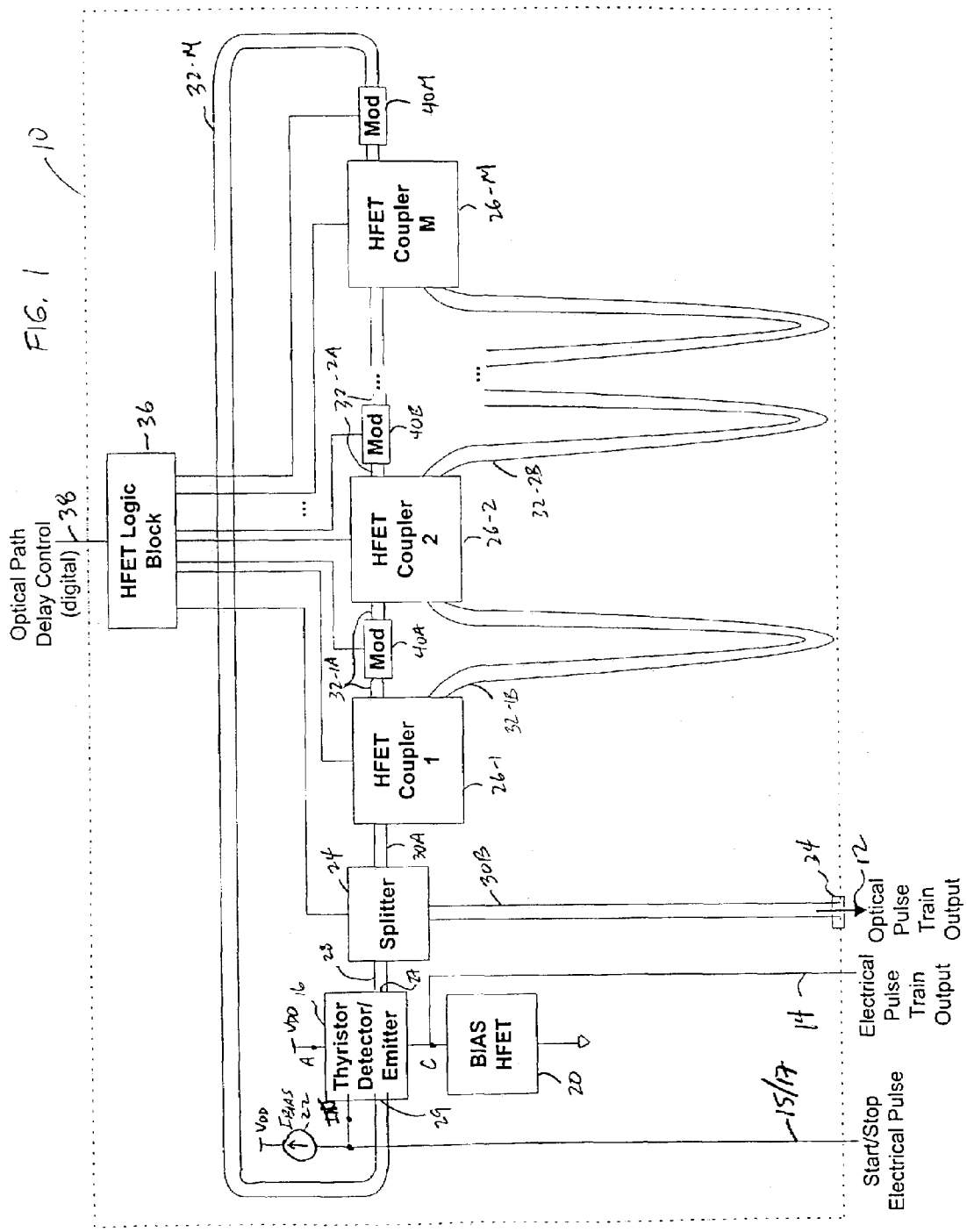
FIG. 1 is a schematic diagram of an optoelectronic integrated circuit that generates an optical clock signal and electrical clock signal of varying frequency and possibly varying duty cycle.

Turning now to FIG. 1, there is shown a schematic illustration of the elements of an optoelectronic integrated circuit 10 that is capable of generating both an optical clock signal 12 (labeled "optical pulse train output") and an electrical clock signal 14 (labeled electrical pulse train output"). The optoelectrical clock signals 12, 14 are produced by optical regenerative feedback of a thyristor detector/emitter device 16. The thyristor detector/emitter device 16 is configured to operate as an optical detector that detects an input optical pulse and as a vertical cavity laser that produces an output optical pulse in response to the detected input optical pulse. In addition, the thyristor detector/emitter device 16 produces at its cathode terminal C an output electrical pulse, which corresponds to the output optical pulse, in response to the detected input optical pulse. Details of the operation of the thyristor detector/emitter device 16 is set forth in detail in U.S. application Ser. No. 10/280,892, filed on Oct. 25, 2002, entitled "Optoelectronic Device Employing at least one Semiconductor Heterojunction Thyristor for Producing Variable Electrical/Optical Delay," incorporated by reference above in its entirety.

The configuration of the thyristor as a detector/emitter is achieved by applying a forward bias between the anode and cathode terminals of the thyristor device 16. This may be accomplished, for example, by coupling the anode terminal A to a positive supply voltage $V_{DD}$ and the cathode terminal C to ground through a load resistance (for example, an HFET device 20 configured as a load resistor) as shown. In addition, the n-channel injector terminal INJ is forward biased with respect to the anode terminal A through a current source 22 that generates a bias current $I_{BIAS}$. When an input optical pulse is incident on the thyristor device 16, in the event that the incident light has sufficient intensity to produce photocurrent in excess of the bias current $I_{BIAS}$ drawing on the n-channel injector terminal INJ and such photocurrent produces the critical switching charge $Q_{CR}$ in the n-type QW channel of thyristor device 16, the thyristor device 16 will switch to its conducting/ON state. In the ON state, the current I through the device 16 is above the threshold for lasing and laser emission occurs to produce light that resonates in the cavity of the thyristor device 16 to form the output optical pulse. In addition, a corresponding output electrical pulse is produced at the cathode terminal C of the thyristor device 16. When the incident light is reduced, the thyristor device 16 will switch to the OFF state because the bias current $I_{BIAS}$ drawing on the n-channel injector terminal INJ drains the n-type QW channel of charge, which causes the channel charge to fall below the holding charge QH. In the OFF state, the current I through the device is below the threshold for lasing and the laser emission ceases. In addition, the corresponding electrical pulse produced at the cathode terminal C terminates when the device 16 switches to the OFF state. In this manner, the thyristor device 16 operates as an optical detector that detects an input optical pulse and as a vertical cavity laser that produces a corresponding output optical pulse (and corresponding output electrical pulse) in response to the detected input optical pulse.

Through optical regenerative feedback, the optical pulses emitted by the thyristor detector/emitter device 16 (or optical signals derived therefrom) are returned back to the thyristor laser/emitter device 16 to induce the thyristor detector/emitter device 16 to generate the optoelectrical clock signals 12, 14 (e.g., a series of optical/electrical pulses).

In order to start the optoelectronic pulse generation operations of the thyristor detector/emitter device 16, a start electrical pulse signal 15 is supplied to the injector terminal INJ of the thyristor device 16 to trigger the thyristor device 16 to produce an initial output optical pulse and corresponding initial output electrical pulse. Optical regenerative feedback of the initial output optical pulse emitted by the thyristor detector/emitter device 16 (or optical signals derived therefrom) is used to induce the thyristor detector/emitter device 16 to generate the optoelectrical clock signals 12, 14 (e.g., a series of optical/electrical pulses). The start electrical pulse signal 15 provides a pulse of sufficient intensity (e.g., in the configuration shown, a downward going pulse is used), which counteracts the bias current $I_{BIAS}$ drawing on the n-channel injector terminal INJ, to produce the critical switching charge $Q_{CR}$ in the n-type QW channel of thyristor device 16, thereby switching the thyristor device 16 into its conducting/ON state. In the ON state, the current I through the device 16 is above the threshold for lasing and emission occurs to produce light that resonates in the cavity of the thyristor device 16 to form the initial output optical pulse. In addition, a corresponding initial output electrical pulse is produced at the cathode terminal C of the thyristor device 16. When the start electrical pulse 15 terminates, the thyristor device 16 will switch to the OFF state because the bias current $I_{BIAS}$ provided by the current source 22 to the n-channel injector terminal INJ drains the n-type QW channel of charge, which causes the channel charge to fall below the holding charge $Q_H$. In the OFF state, the current I through the device is below the threshold for lasing and the laser emission ceases. In addition, the corresponding electrical pulse produced at the cathode terminal C terminates when the device 16 switches to the OFF state.

In order to terminate the optoelectronic pulse generation operations of the thyristor detector/emitter device 16, a stop electrical pulse signal 17 (of opposite polarity of the start electrical pulse 15) is supplied to the injector terminal INJ of the thyristor device 16 that deactivates the thyristor device 16 such that it does not produce an output optical pulse and corresponding output electrical pulse. The stop electrical pulse signal 17 works in conjunction with the bias current $I_{BIAS}$ drawing on the n-channel injector terminal INJ such that an optical pulse incident on input port 29 will not produce the critical switching charge $Q_{CR}$. In this manner, the device 16 remains in the OFF state whereby laser emission does not occur, and the optoelectronic pulse generation operations of the thyristor detector/emitter device 16 are terminated.

Preferably, the frequency of the optoelectrical clock signals 12, 14 is varied over a predetermined range of frequencies by adjusting the optical path length of the optical regenerative feedback signal between the output optical port 27 and the input optical port 29 of device 16. In the preferred embodiment of the present invention, such optical path length adjustment is provided by a programmable optical delay line that is disposed between the output optical port 27 and the input optical port 29 of device 16. Preferably, the programmable optical delay line is realized from an optical delay network formed by an optical splitter 24, a series of directional couplers (labeled 26-1 . . . 26-M) and corresponding passive waveguides (labeled 28, 30A, 32-1A, 32-1B, 32-2A, 32-2B, . . . 32-M) that are integral to the integrated circuit 10 as shown. In this configuration, the optical signal (e.g., optical pulse train output) produced by the thyristor detector/emitter device 16 is output at its output port 27 where it is guided by passive integrated waveguide 28 to the optical splitter device 24. The optical splitter device 24 splits the optical signal supplied thereto into two portions: the first portion is directed to the first directional coupler 26-1 via passive waveguide 30A, and the second portion is directed to the output port 34 of the integrated circuit 10 via passive waveguide 30B. Note that the optical splitter 24 may be realized by a coupling device similar in structure to the directional couplers as described below whereby the control signals that control the switching mode of the device are adapted to provide for splitting the input optical signal into the two portions.

The directional couplers (26-1 . . . 26-M) provide directional switching of the optical signals supplied thereto in response to control signals supplied thereto. More specifically, each given directional coupler (26-x) is controlled to operate in one of a pass-through mode or crossover mode. In the pass-through mode, the optical signal supplied to the channel A input of the given directional coupler 26-x passes through to the channel A output of the given directional coupler 26-x and the optical signal supplied to the channel B input of the given directional coupler 26-x passes through to the channel B output of the given directional coupler 26-x. In the crossover mode, the optical signal supplied to the channel A input of the given directional coupler 26-x crosses over to the channel B output of the given directional coupler 26-x and the optical signal supplied to the channel B input of the given directional coupler 26-x crosses over to the channel A output of the given directional coupler 26-x. Note that the first directional coupler device 26-1 utilizes only one input port, and the last directional coupler device 26-M utilizes only one output port. Thus, the directional switching function performed by these devices is limited by this configuration.

Two passive waveguides of different length (for example, 32-1A, 32-1B) are operably coupled between each pair of directional couplers. One of these passive waveguides (for example, 32-1B) provides a longer optical path than the other passive waveguide (for example 32-1A). In this configuration, the control signals supplied to the directional coupler devices 26-1 . . . 26-M enables selection of a variable optical path length through which optical signals pass in traversing the network. Preferably such control signals are provided by a transistor logic block 36 integral to the OEIC 10 that is adapted to generate the appropriate control signals in response to an optical path delay control signal (in digital form) supplied thereto over data path 38 as shown in FIG. 1. The optical signal output from the last directional coupler 26-M is directed back to the input port 29 of the thyristor detector/emitter device 16 by a passive waveguide device 32-M, to thereby complete the regenerative feedback loop.

In order to limit crosstalk and improve the extinction ratio between the crossover and pass-through modes of operation of the directional couplers as described above, digital optical modulators (labeled 40A . . . 40M) may be operably coupled in the optical path between the directional couplers as shown. A digital optical modulator operates in one of two distinct optical states in modulating an input optical signal. In optical state 1, there is substantially no loss to the input optical signal via absorption. In optical state 2, substantially all of the input optical signal is absorbed. In this configuration, a given digital optical modulator (40-x) is controlled to operate in the absorbing optical state 2 when the corresponding directional coupler (26-x), which is directly upstream from the modulator, is operated in the crossover mode; furthermore, the given digital optical modulator is controlled to operate in the non-absorbing optical state 1 when the corresponding directional coupler is operated in the pass-through mode. Such operations limit crosstalk and improve the extinction ratio between the crossover and pass-through modes of operation of the directional couplers.

The digital optical modulators of FIG. 1 may be realized by a heterojunction thyristor device wherein an optical path is provided laterally through the device, and a control signal is applied to the injector terminal INJ of the thyristor device. When the control signal produces a forward bias between the injector terminal INJ and the anode terminal A sufficient to produce charge in the QW channel(s) of the device greater than the critical switching charge $Q_{CR}$, the heterojunction thyristor device operates in its conducting/ON state. The device is biased such that the current I through the device in the ON state is substantially below the threshold for lasing (preferably about 0.5 to 0.7 of the lasing threshold current). In this configuration, in the ON state, the device operates in optical state 1 whereby there is substantially no loss to the input optical signal via absorption. When the control signal produces a reverse bias between the injector terminal INJ and the anode terminal A, charge is drawn from the injector terminal INJ such that the channel charge in the QW channel(s) of the device falls below the hold charge $Q_H$, and the heterojunction thyristor device operates in its non-conducting/OFF state. In the OFF state, the device operates in optical state 2 whereby substantially all of the input optical signal is absorbed.

Figure 13:
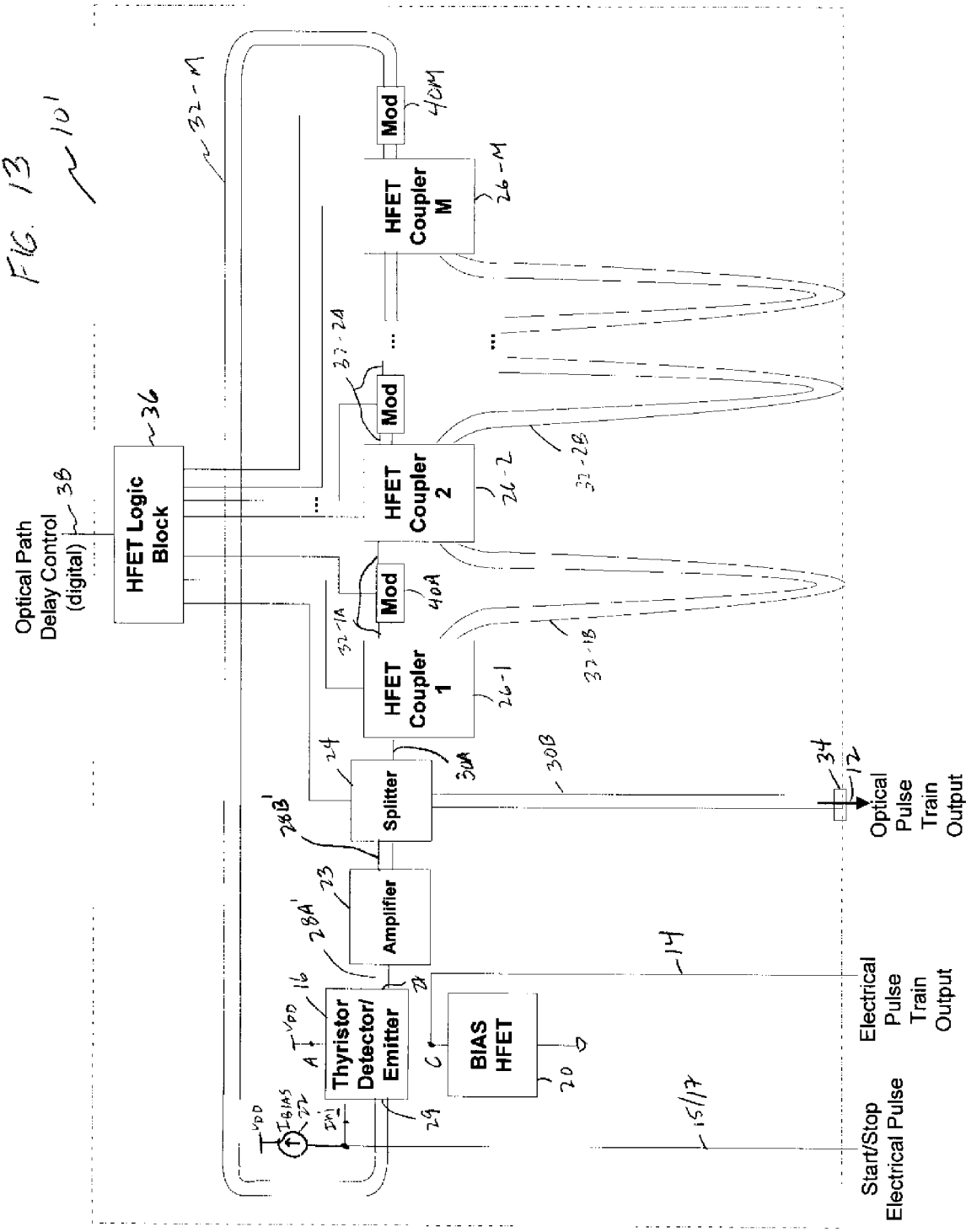
FIG. 13 is a schematic diagram of an optoelectronic integrated circuit in accordance with the present invention.

It is also contemplated that the feedback optical path between the output port 27 and input port 29 of the thyristor detector/emitter device 16 may include one or more optical amplifiers (for example, one shown as amplifier 31 in FIG. 13) that provide a variable amount of optical gain to the optical signal(s) supplied thereto (under control of control signals supplied thereto) to compensate for insertion losses and absorption losses. An optical amplifier amplifies an input optical signal to produce a corresponding output optical signal with an increased intensity level.

The optical amplifiers may be realized by a heterojunction thyristor device wherein an optical path is provided laterally through the device, and a forward bias is applied between the injector terminal INJ and cathode terminal C, and a forward bias is applied between the anode terminal A and cathode terminal C through a load resistance that sets the current through the device between the anode terminal A and cathode terminal C in the ON state at a point substantially below lasing threshold. In this configuration, in the ON state, the device amplifies an input optical signal to produce a corresponding output optical signal with an increased intensity level. The optical amplifier may be switched into and out of the ON state by applying forward and reverse biases to the injector terminal INJ with respect to the anode terminal A as described above. The gain of the optical amplifier in the ON state and thus the output signal intensity level may be changed by adjusting the current through the device between the anode terminal A and cathode terminal C in the ON state.

It is also contemplated the splitter 24, passive waveguide 30B and output port 34 may be omitted for applications that do not require the output of the optical clock signal 14 from the OEIC 10. Alternatively, the transmission line 12 may be omitted for applications that do not require the output of the electrical clock signal.

Figure 14:
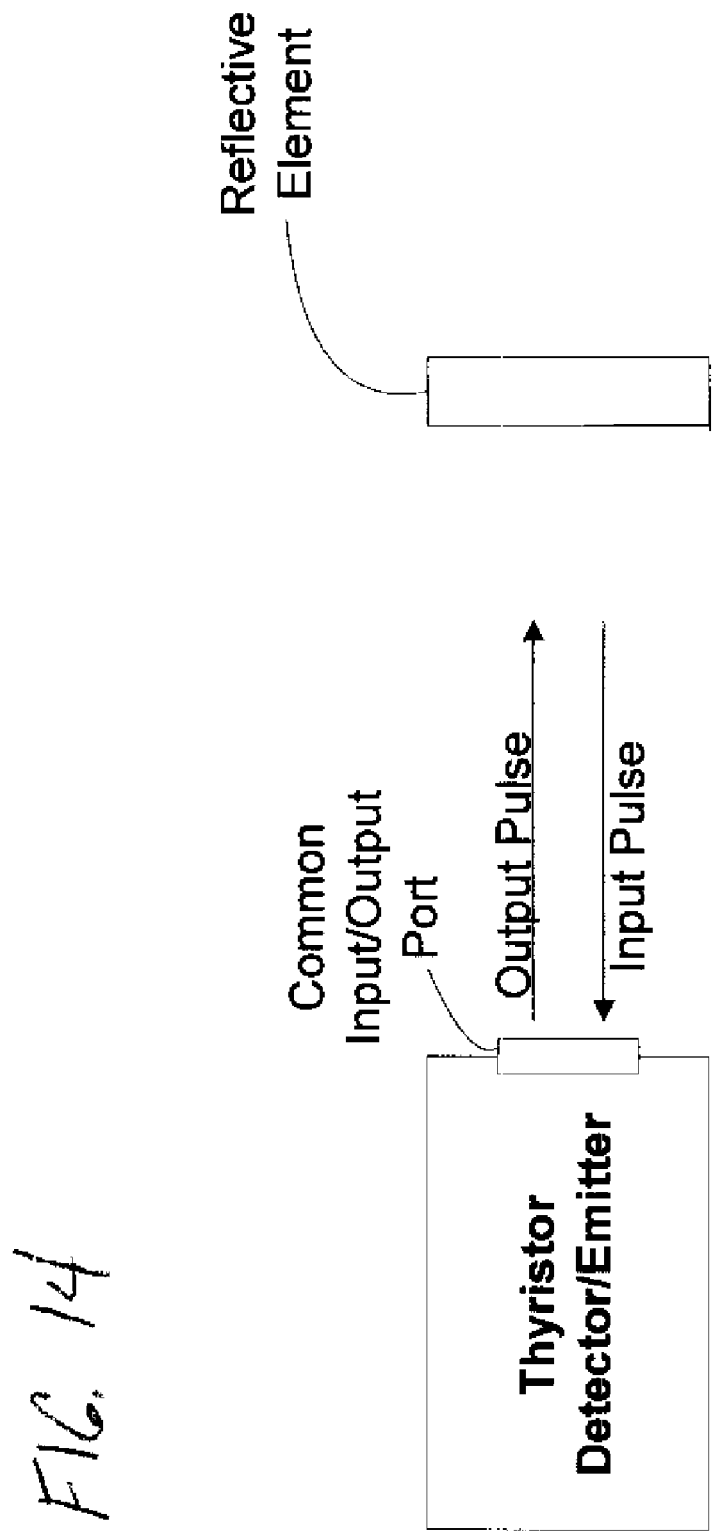
FIG. 14 is a schematic diagram of optoelectronic circuitry in accordance with the present invention.

In an alternate embodiment, the feedback optical path between the output port 27 and input port 29 of the chyristor detector/emitter device 16 may be realized by a fiber operably coupled therebetween. In yet another alternate embodiment as shown in FIG. 14, the thynstor detector/emitter device 16 may utilize a single port. In this configuration, the optical pulse signal produced by the thyristor detectodemitter device 16 is output from this port and then redirected back to the port. Such redirection may be provided by a reflective element, such as cleaved edge of the OEIC 10, a mirror or other suitable optical reflection means. Such a configuration may be useful where the thyristor detector/emitter device 16 operates as a surface emitting vertical cavity laser device.

Figure 2:
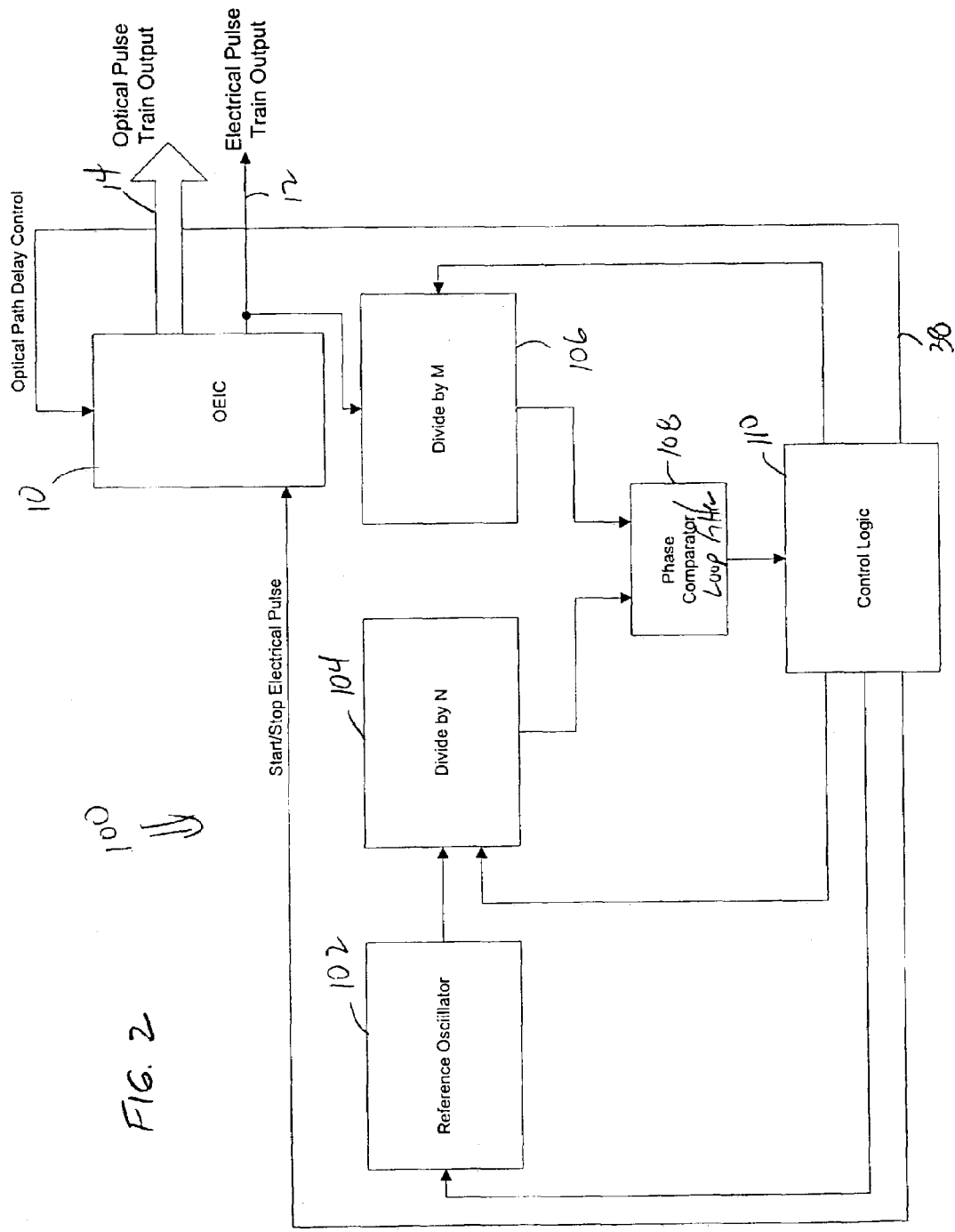
FIG. 2 is a schematic diagram of a phased-look loop architecture that includes the optoelectronic integrated circuit of FIG. 1.

The optoelectronic clock signal generator of FIG. 1 may be used in a phased-lock loop architecture 100 as shown in the functional block diagram of FIG. 2, which includes a reference oscillator 102 (which may be realized by an oscillator, direct digital synthesizer or other frequency synthesizer), a first divider 104 that divides down the frequency of the reference oscillator 104 by a factor N and a second divider 106 that divides down the frequency of the electrical clock signal 12 produced by the OEIC 10 by a factor M. A phase comparator/loop filter 108 generates a control signal characteristic of the phase difference between output of the two dividers 104, 106. The control signal is supplied to control logic 110, which is adapted to vary the optical delay path length of the optical feedback path in the OEIC (via optical path delay control signals supplied thereto over data path 38) to vary the frequency of the optoelectronic clock signals 12, 14 produced by the OEIC such that the phase difference is minimized.

In the phase lock loop architecture of FIG. 2, the frequency of the optoelectrical clock signals 12,14 produced by the OEIC 10 is controllably selected by setting either one (or both) of the factors N and M for the dividers 104,106, which is preferably accomplished via control signals supplied by control logic 110 to the dividers to effect such settings. The frequency of the optoelectrical clock signals 12,14 may also be controllably selected by varying the frequency of the oscillating signal produced by the reference oscillator 102, which is preferably accomplished via control signals supplied by control logic 110 to the reference oscillator to effect such settings. In addition, the control logic 110 supplies the start electrical pulse signal and stop electrical pulse to the OEIC 10 to start and stop the optoelectronic clock generation operations of the OEIC as described above in detail.

The duty cycle (e.g., time duration of the ON state/OFF state) of the optoelectronic clock signals) of the optoelectrical clock signals 12,14 produced by the OEIC 10 may also be varied. As described in detail in U.S. patent application Ser. No. 10/280,892, filed on Oct. 25, 2002, incorporated by reference above in its entirety, such duty cycle control can be accomplished by controlling an optical amplifier (not shown) to modulate the optical power of the optical pulse train supplied to the input optical port 29 of the thyristor detector/emitter device 16, or by controlling the current source 22 to modulate the amount of bias current that is drawn from the injector terminal INJ of the thyristor detector/emitter device 16. Preferably, such control operations are accomplished by control signals generated by the control logic 110 and supplied to the optical amplifier and/or variable current source to effect such duty cycle control.

Preferably, the thyristor detector/emitter 16, bias transistor 20, passive waveguides (28, 30A, 30B, 32-1A, 32-1B, 32-2A, 32-2B, . . . 32-M), directional coup (26-1 . . . 26-M), digital optical modulators (40A . . . 40M), optical amplifiers (not shown), and transistor logic 36a of the optoelectronic circuits of FIG. 1 are realized from the inversion quantum-well channel device structures as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; U.S. patent application Ser. No. 10/340,942, entitled "Method of Fabricating Semiconductor Devices Employing At Least One Modulation Doped Quantum Well Structure and One or More Etch Stop Layers for Accurate Contact Formation," filed on Jan. 13, 2003; all of which are hereby incorporated by reference in their entireties. With these structures, a single fabrication sequence is used to make all the devices, including the electrical devices (e.g., bias transistor and transistor logic block 36), the optoelectronic devices (e.g., detector/emitter device 16, directional couplers 26-1 . . . 26-M, splitter 24, modulators 26-1 . . . 26-M, optical amplifier(s)) and the optical devices (e.g., passive waveguide structures). In other words, a single set of n type and p type contacts, critical etches, dielectric depositions etc. are used to realize all of these devices simultaneously. The features of this device structure include 1) a bottom DBR mirror, 2) a sequence of layers formed on the bottom DBR mirror including a bottom n-type layer(s), p-type and n-type modulation doped QW structures, and a top p-type layer(s), 3) self-aligned contacts to the p-type and n-type QW structures formed by ion implantation, 4) n-type metal contacts to n-type ion implants and the bottom n-type layer(s), 5) a p-type metal contact to the p-type ion implants and the top p-type layer(s), and 6) a refractory metal formed on the p-type metal contact. Optical devices are created from these structures by separating the refractory metal into two sections which are connected electrically by the p-type metal contact layer(s) along the top surface. By depositing a top dielectric mirror over the device structure, a waveguide is formed with an optical mode centered between the bottom DBR mirror and the top dielectric mirror.

Figure 3:
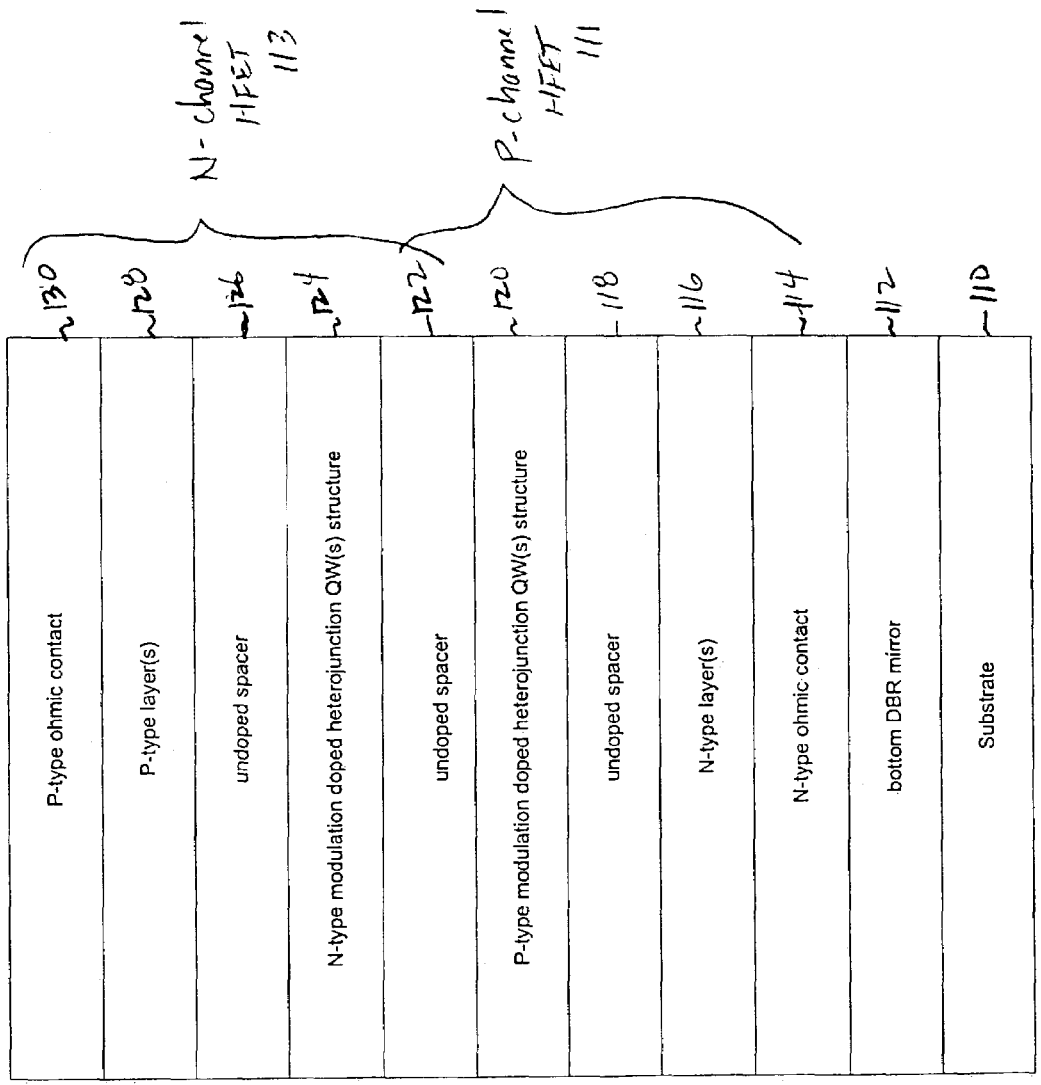
FIG. 3 is a schematic showing an exemplary inversion quantum-well channel layer structure from which devices of the optoelectronic integration circuit of FIG. 1 can be realized.

Turning now to FIG. 3, an exemplary multi-layer sandwich structure from which optoelectronic and electronic devices of the OEIC 10 of FIG. 1 can be realized, includes a bottom dielectric distributed bragg reflector (DBR) mirror 112 formed on a substrate 110. The bottom DBR mirror 112 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave (¼n) optical thickness, the reflections from each of the boundaries will be added in phase to produce a large amount of reflected light (e.g., a large reflection coefficient) at the particular center wavelength $\lambda_D$. Deposited upon the bottom DBR mirror 112 is the active device structure which consists of two HFET devices. The first of these is a p-channel HFET 111 (comprising layers 114, 116, 118, 120 and 122) which has one or more p-type modulation doped QWs and is positioned with the gate terminal on the lower side (i.e. on the bottom DBR mirror 112) and the collector terminal on the upper side. The second of these is an n-channel HFET 13 (comprising layers 122, 124, 126, 128, 130) which has one or more n-type modulation doped QWs and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with n-type ohmic contact layer(s) 114 which enables the formation of ohmic contacts thereto. Deposited on layer 114 is an n-type layer 116. Layer 116 is also made sufficiently thin to enable current tunneling therethrough during operation of optoelectronic/electronic devices realized from this structure. Preferably, the doping of this layer 116 is such that it should not be depleted in any range of operation of the device, i.e. the total doping in this layer should exceed the total doping charge contained in the modulation doped layer of the p-type modulation doped QW structure 120 described below. In this configuration, layer 114 achieves low contact resistance and layer 116 defines the capacitance of the p-channel HFET 111 with respect to the p-type modulation doped QW heterostructure 120. This layer 116 also serves optically as a small part of the lower waveguide cladding for optical devices realized in this structure. Note that a majority of the lower waveguide cladding is provided by the lower DBR mirror 112 itself. Deposited on layer 116 is an undoped layer 118. Layers 114, 116 and 118 serve electrically as part of the gate of the p-channel HFET 111. Deposited on layer 118 is a p-type modulation doped QW structure 120 that defines one or more quantum wells (which may be formed from strained or unstrained heterojunction materials). Deposited on the p-type modulation doped QW structure 120 is an undoped spacer layer 122, which forms the collector of the P-channel HFET device 111. All of the layers grown thus far form the P-channel HFET device 111 with the gate ohmic contact on the bottom.

Undoped spacer layer 122 also forms the collector region of the N-channel HFET device 113. Deposited on layer 122 is a n-type modulation doped QW structure 124 that defines one or more quantum wells (which may be formed from strained or unstrained heterojunction materials). Deposited on the n-type modulation doped QW structure 124 is an undoped layer 126. Deposited on layer 126 is a p-type layer structure 128. Layer 128 is made sufficiently thin to enable current tunneling therethrough during operation of optoelectronic/electronic devices realized from this structure. Preferably, the doping of layer 128 is such that it should not be depleted in any range of operation of the device, i.e. the total doping in this layer should exceed the total doping charge contained in the modulation doped layer of the n-type modulation doped QW structure 124 described above. Layer structure 128 also serves optically as a small part of the upper waveguide cladding for optical devices realized in this structure. Note that a majority of the upper waveguide cladding is provided by the upper DBR mirror (not shown). Deposited on the p-type layer structure 128 is a p-type ohmic contact layer(s) 130 which enables the formation of ohmic contacts thereto. Layers 126, 128 and 130 serve electrically as part of the gate of the n-channel HFET 113. In this configuration, layer 130 achieves low contact resistance and layer 128 defines the capacitance of the n-channel HFET 113 with respect to the n-type modulation doped QW heterostructure 124.

Alternatively, the active device structure may be described as a pair of stacked quantum-well-base bipolar transistors formed on the bottom DBR mirror 112. The first of these is an n-type quantum-well-base bipolar transistor (comprising layers 114, 116, 118, 120 and 122) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 122, 124, 126, 128, 130) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the gate terminal of the p-channel HFET device 111 corresponds to the emitter terminal of the p-type quantum-well-base bipolar transistor, the p-type QW structure 120 corresponds to the base region of the p-type quantum-well-base bipolar transistor, spacer layer 122 corresponds to the collector region of both the p-type quantum-well-base bipolar transistor and the n-type quantum-well-base bipolar transistor, the n-type QW structure 124 corresponds to the base region of the n-type quantum-well-base bipolar transistor, and the gate terminal of the n-channel HFET device 113 corresponds to the emitter electrode of the n-type quantum-well-base bipolar transistor.

To form a resonant cavity device where light is input into and emitted from the device laterally (i.e., from a direction normal to the cross section of FIG. 3), a diffraction grating (for example, as described in detail in U.S. Pat. No. 6,031,243) and top dielectric mirror are formed over the active device structure described above. For vertical cavity lasing devices, the diffraction grating performs the function of diffracting light produced by the vertical cavity into light propagating laterally in a waveguide which has the top dielectric mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity. The distance between the top dielectric mirror and bottom DBR mirror preferably represents an integral number of ½ wavelengths at the designated wavelength. This distance is controlled by adjusting the thickness of one or more of the layers therebetween to enable this condition.

The multilayer structure described above may be realized with a material system based on group III-V materials (such as a GaAs/AlGaAs). Alternatively, strained silicon heterostructures employing silicon-germanium (SiGe) layers may be used to realize the multilayer structures described herein. Moreover, the multilayer structure of FIG. 3 may be used to realize various optoelectronic devices, including heterojunction thyristor devices that are configured to operate as a detector/emitter, optical modulator, amplifier, etc.), an array of transistor devices (including n-channel HFET devices, p-channel HFET devices, n-type quantum-well-base bipolar transistors and p-type quantum-well-base bipolar transistors), and waveguide devices.

Figure 4:
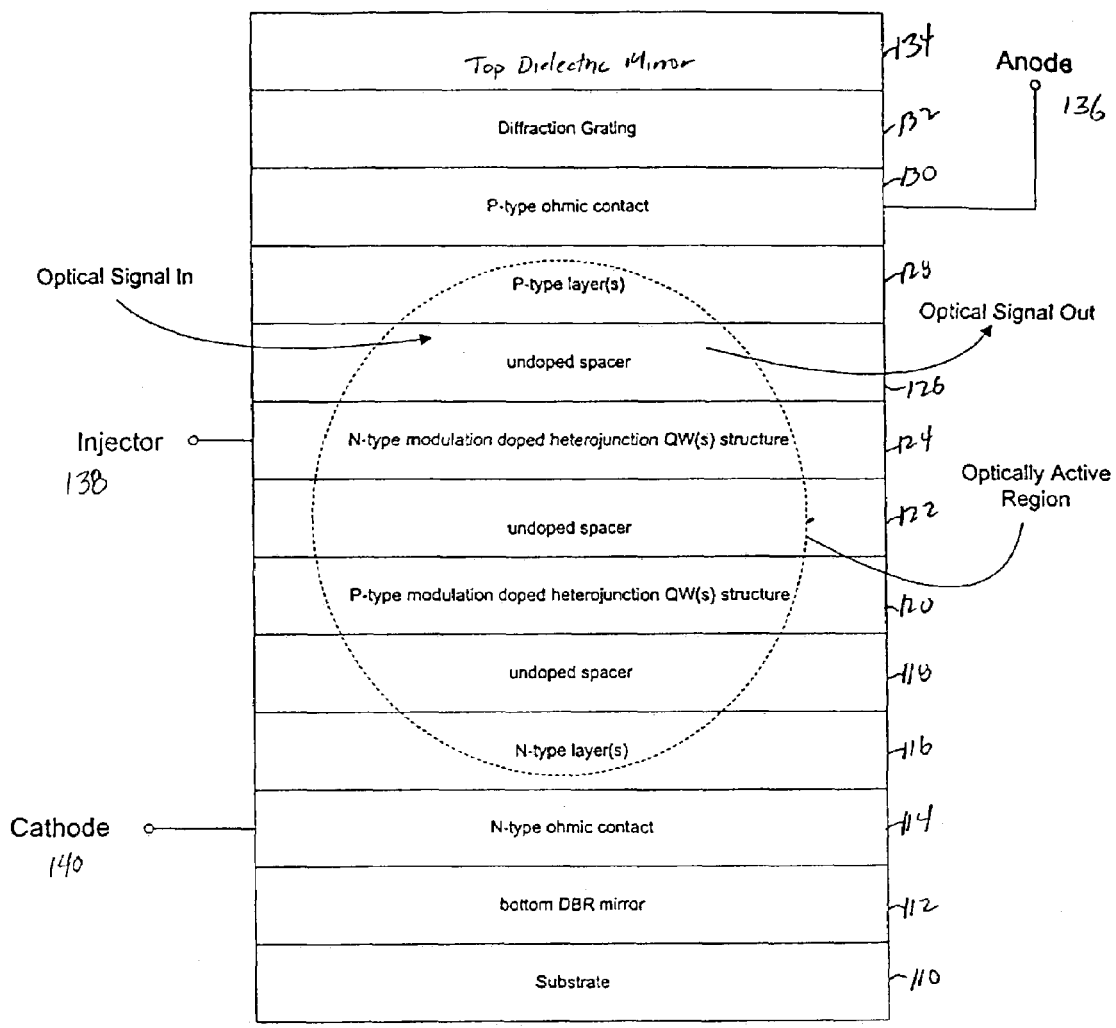
FIG. 4 is a schematic view showing the generalized construction of an exemplary heterojunction thyristor formed from the inversion quantum-well channel layer structure of FIG. 3.

FIG. 4 illustrates an exemplary heterojunction thyristor device realized from the multilayer sandwich of FIG. 3. As shown, one or more anode terminal electrodes (one shown as 136) are operably coupled to the p-type ohmic contact layer 130, one or more n-channel injector terminal electrodes (one shown as 138) are operably coupled to the n-type QW structure 124, and one or more collector terminal electrodes (one shown as 140) are operably coupled to the n-type ohmic contact layer 114. In alternative embodiments, one or more p-channel injector terminals (not shown) that are operably coupled to the p-type inversion QW structure 120 may be added. In such a configuration, the p-channel injector terminals may be used to control charge in such p-type inversion QW channel(s) as described herein. In yet another alternative embodiment, the one or more N-channel injector terminals 138 may be omitted. In such a configuration, the p-channel injector terminals (38C, 38D), which are coupled to the p-type inversion QW structure 120 are used to control charge in such p-type inversion QW channel(s) as described herein.

Figure 5:
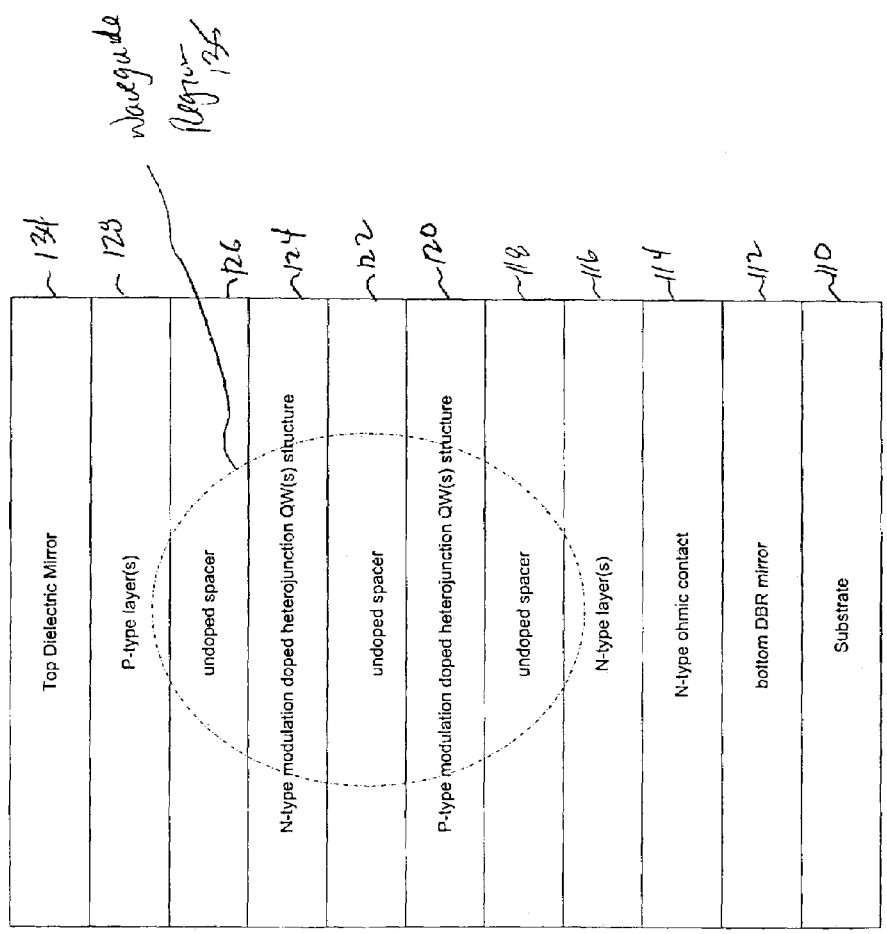
FIG. 5 is a schematic view showing the generalized construction of an exemplary in-plane waveguide formed from the inversion quantum-well channel layer structure of FIG. 3.

The multilayer structure of FIG. 3 may also be used to produce an in-plane passive waveguide as shown in FIG. 5. In such a configuration, the p-type ohmic contact layer 130 is selectively removed in order to minimize waveguide loss. The waveguide ridge cross-section is formed by a combination of several mesas, which are formed by vertical/horizontal surfaces formed in the layers between the top dielectric mirror and the bottom DBR mirror, to thereby form a waveguide region 135 that provides laterally guiding and vertical guiding of light therein.

Figure 6:
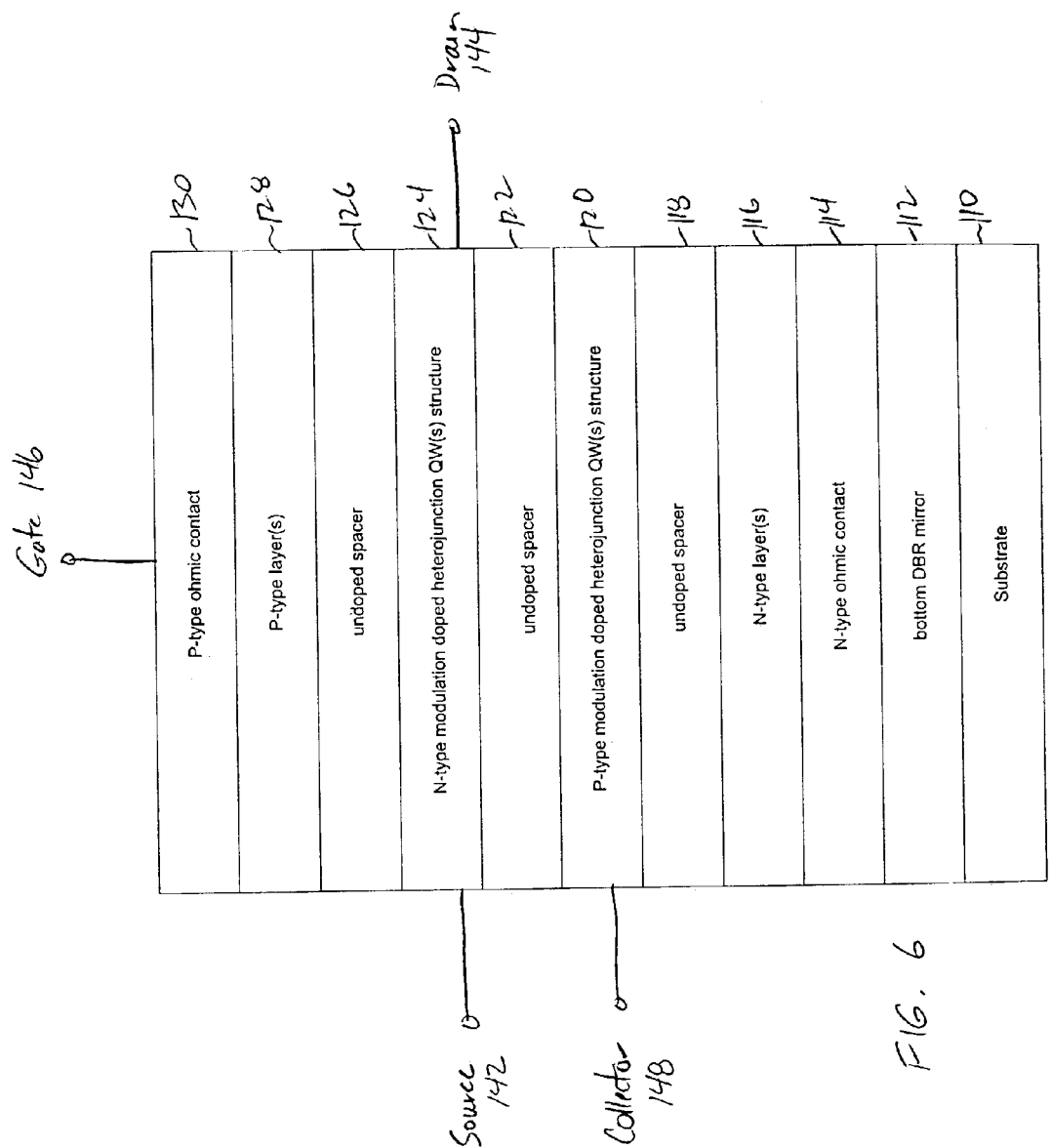
FIG. 6 is a schematic view showing the generalized construction of an exemplary HFET device formed from the inversion quantum-well channel layer structure of FIG. 3.

FIG. 6 illustrates an exemplary n-channel HFET device realized from the multilayer sandwich of FIG. 3. As shown, a source terminal electrode 142 and a drain terminal electrode 144 are electrically coupled to the n-type QW structure 124 to form a channel region therebetween. A gate terminal electrode 146 is formed on the p-type ohmic contact layer 130 and covers the n-type QW inversion channel. Preferably, one or more collector terminal electrodes 148 are electrically coupled to the p-type QW structure 120 below the n-type QW inversion channel. In this configuration, the collector terminal electrode 148 is preferably connected as a back gate similar to the substrate contact in a silicon-based MOSFET transistor.

Figure 7A:
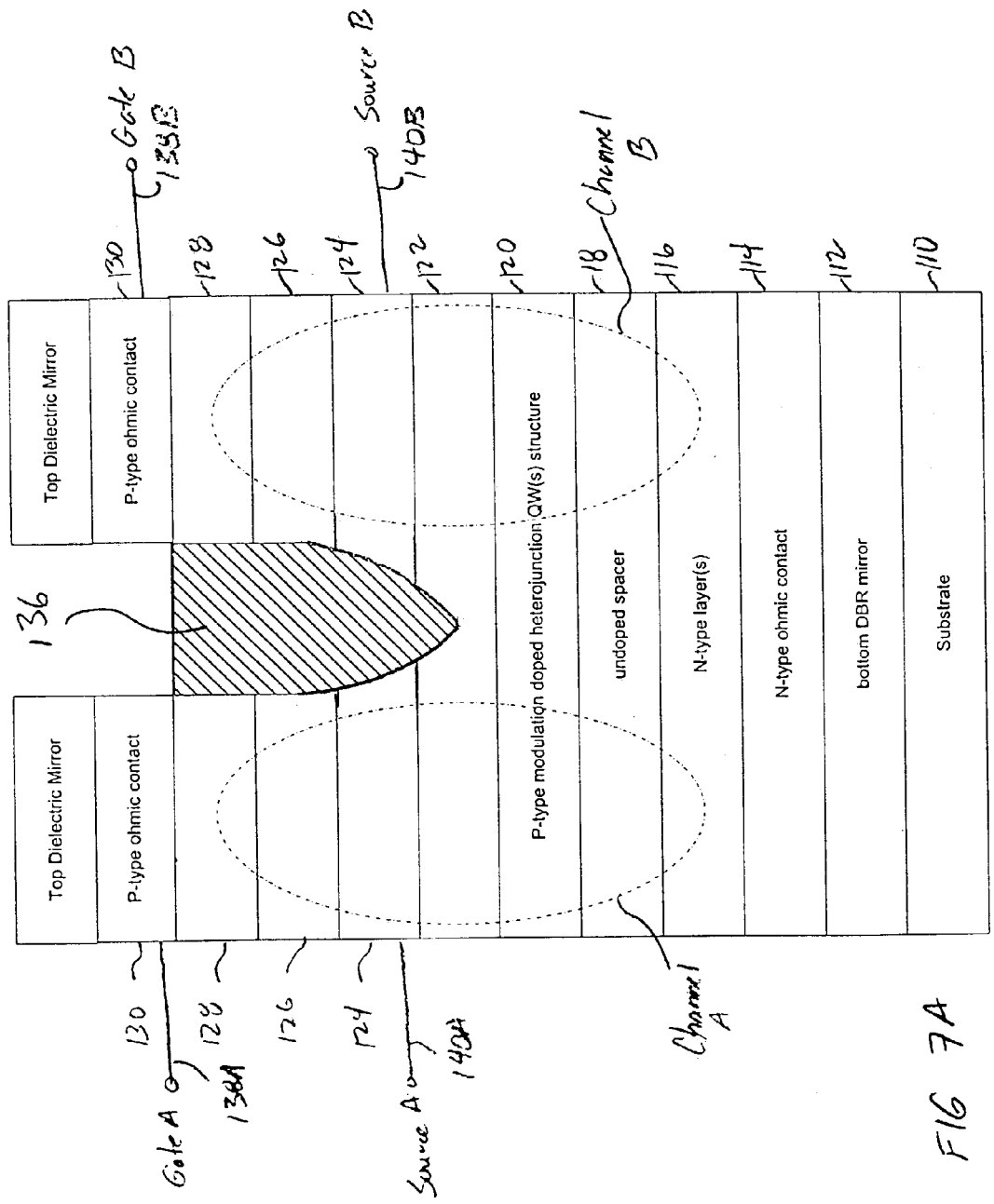
FIG. 7A is a schematic view showing the generalized construction of an exemplary directional coupler device formed from the inversion quantum-well channel layer structure of FIG. 3.

FIG. 7A illustrates an exemplary directional coupler device realized in the multilayer sandwich of FIG. 3. The device includes two elliptical waveguide structures that form the two channels A and B of the device as shown. The modes of these elliptical waveguide structures extend down through the structure to include both the n-type QW channel structure 124 and the p-type QW channel structure 120. Source terminal electrodes for channels A and B (labeled 140A, 140B) are operably coupled to the n-type QW channel structure 124 of the two waveguide structures. The gate terminal electrodes for the two channels A and B (labeled 138A, 138B) are operably coupled to the p-type ohmic contact layer 130 for the two waveguide structures. Note that a narrow passive region 136 separates the two waveguide structures. This passive region blocks the flow of charge (e.g., electrically disconnects) between the n-type QW structure 124 in channel A and channel B. In addition, the gate electrodes for the two waveguide structures (138A, 138B) are not electrically connected because the p-type ohmic contact layer 130 is removed in the region above the passive region 136.

The directional coupler device structure of FIG. 7A operates as a beta coupler switching device as illustrated in the plan view shown in FIGS. 7B1 and 7B2. Note that there are two elliptical modes, corresponding to the two channels A and B of the device. When a sufficient positive forward bias is applied between the gate terminal and the source terminal of one channel such that gate conduction injects charge into only the one channel and not the other channel (e.g., by applying a sufficient positive forward bias between the gate terminal and the source terminal of channel A such that gate conduction injects charge into only channel A and not into channel B), there is a change introduced between the relative propagation constants of the two channels A and B. By varying the propagation constant of the two channels A and B, the number of evanescent couplings within the length of the device can be controlled. When one evanescent coupling occurs during the length of the device, the optical mode in channel A crosses over to channel B (labeled "AB" in FIG. 7B1), and the optical mode in channel B crosses over to channel A (labeled "BA" in FIG. 7B2). However, when two evanescent couplings occur during the length of the device, the mode in channel A remains in channel A (labeled "AA" in FIG. 7B1), and the mode in channel B remains in channel B (labeled "BB" in FIG. 7B2). In this manner, the control signals supplied to the directional coupler controls the optical path of the optical signal passing through the device whereby the input optical signal (which may be provided at channel-A input or the channel-B input) is selectively output to either the channel-A output or channel-B output in response to these control signals. Preferably, these control are provided by HFET transistor logic block 36 integrated with the directional coupler device as best shown in FIG. 1. By this means, it is possible to provide integrated logic circuits which can perform the decode function on a digital word. Therefore the capability offered by the technology is the integration of very small (on the order of 100-300 µm in length) directional couplers interfacing to on-chip passive waveguides and integrated together with other optoelectronic devices and electronic devices.

Preferably, the narrow passive region 136 of FIG. 7A that separates the two waveguide structures (channels A and B) is formed using impurity free vacancy disordering (IFVD). More specifically, an oxide layer (e.g., $SiO_2$) is deposited such that it covers a window region through the p-type ohmic contact layer 130. The next step is a rapid thermal annealing operation. In this step, the window region covered with the oxide layer experiences Impurity Free Vacancy Disordering (IFVD). Such vacancy disordering produces a disorder region that blocks the flow of charge between the channels A and B due to the increased band gap in this region. Advantageously, this process allows the passive region 136 to be very narrow (on the order of 1 micron). This allows the two channels A and B to be located in close proximity to one another, which provides improved evanescent coupling strength. This improved evanescent coupling strength enables the evanescent transfer between channels to take place over a much shorter distance, thereby enabling smaller devices and improved integration capabilities with other directional coupling devices, HFET logic devices or other electronic and/or optoelectronic devices.

FIG. 8A illustrates an exemplary epitaxial growth structure utilizing group III-V materials for realizing the multilayer structure of FIG. 3 and the optoelectronic, electrical and optical devices formed from this structure in accordance with the present invention. The structure of FIG. 8A can be made, for example, using known molecular beam epitaxy (MBE) techniques. As shown, a first semiconductor layer 1151 of AlAs and a second semiconductor layer 1152 of GaAs are alternately deposited (with preferably at least seven pairs) upon a semi-insulating gallium arsenide substrate 1149 in sequence to form the bottom distributed bragg reflector (DBR) mirror 112 (FIG. 3). The number of AlAs layers will preferably always be one greater than the number of GaAs layers so that the first and last layers of the mirror are shown as layer 1151. In the preferred embodiment the AlAs layers 1151 are subjected to high temperature steam oxidation to produce the compound $Al_xO_y$ so that a mirror will be formed at the designed center wavelength. Therefore the thicknesses of layers 1151 and 1152 in the mirror are chosen so that the final optical thickness of GaAs and $Al_xO_y$ are one quarter wavelength of the center wavelength $\lambda_D$. Alternatively the mirrors could be grown as alternating layers of one quarter wavelength thickness of GaAs and AlAs at the designed wavelength so that the oxidation step is not used. In that case, many more pairs are required (with typical numbers such as twenty-two pairs) to achieve the reflectivity needed for efficient lasing. Deposited upon the mirror is the active device structure which consists of two HFET devices. The first of these is the p-channel HFET (PHFET) 111 (FIG. 3), which has one or more p-type modulation doped quantum wells and is positioned with the gate terminal on the bottom (i.e. on the mirror 112 just described) and the collector terminal above. The second of these is an n-channel HFET (NHFET) 113, which has one or more n-type modulation doped quantum wells and is positioned with the gate terminal on top and the collector terminal below. The collector region of the NHFET device i 13 also functions as the collector region of the PHFET device 111 (FIG. 3). However, the collector terminal of the NHFET device 113 is a p-type contact to p-type quantum well(s) disposed below (above) the collector region, while the collector terminal of the PHFET device 111 is a n-type contact to n-type quantum well(s) disposed above the collector region. Therefore a non-inverted n-channel device is stacked upon an inverted p-channel device to form the active device structure.

The active-device layer structure begins with layer 1153 of N+ type GaAs that enables the formation of ohmic contacts thereto (for example, when contacting to the cathode terminal of a heterojunction thyristor device or the sub-collector terminal of an n-channel HFET device). Layer 1153 has a typical thickness of about 2000 Å and a typical n-type doping of $3.5 \times 10^{18}$ cm$^{-3}$. The N+ doped GaAs layer 1153 corresponds to the ohmic contact layer 114 of FIG. 3. Deposited on layer 1153 is layer 1154 of n-type $Al_{x1}Ga_{1-x1}As$ with a typical thickness of 500-3000 Å and a typical doping of $5 \times 10^{17}$ cm$^{-3}$. The parameter x1 is in the range between 15% and 80%, and preferably in the range of 30%-40% for layer 1154. This layer serves as part of the PHFET gate and optically as a small part of the lower waveguide cladding of the device. Note that a majority of the lower waveguide cladding for waves propagating in the guide formed by the optically active region of the device is provided by the lower DBR mirror itself. The lower DBR mirror causes the light to be guided partially as a dielectric waveguide and partially as a mirror waveguide. Next are four layers (1155a, 1155b, 1155c, and 1155d) of $Al_{x2}Ga_{1-x2}As$. These four layers (collectively, 1155) have a total thickness about 380-500 Å and where x2 is about 15%. The first layer 1155a is about 60-80 Å thick and is doped N+ type in the form of delta doping. The second layer 1155b is about 200-300 Å thick and is undoped. The third layer 1155c is about 80 Å thick and is doped P+ type in the form of delta doping. The fourth layer 1155d is about 20-30 Å thick and is undoped to form a spacer layer. This layer forms the lower separate confinement heterostructure (SCH) layer for the laser, amplifier and modulator devices. The n-type AlGaAs layer 1154 and n-type AlGaAs layer 1155a correspond to the n-type layer(s) 116 of FIG. 3, and the undoped AlGaAs layer 1155b corresponds to the undoped spacer layer 118 of FIG. 3.

The next layers define the quantum well(s) that form the inversion channel(s) during operation of the PHFET 111. For a strained quantum well, this consists of a spacer layer 1156 of undoped GaAs that is about 10-25 Å thick and then combinations of a quantum well layer 1157 that is about 40-80 Å thick and a barrier layer 1158 of undoped GaAs. The quantum well layer 1157 may be comprised of a range of compositions. In the preferred embodiment, the quantum well is formed from a $In_{0.2}Ga_{0.8}AsN$ composition with the nitrogen content varying from 0% to 5% depending upon the desired natural emission frequency. Thus, for a natural emission frequency of 0.98 µm, the nitrogen content will be 0%; for a natural emission frequency of 1.3 µm, the nitrogen content will be approximately 2%; and for a natural emission frequency of 1.5 µm, the nitrogen content will be approximately 4-5%. The well barrier combination will typically be repeated (for example, three times as shown), however single quantum well structures may also be used. Unstrained quantum wells are also possible. Following the last barrier of undoped GaAs is a layer 1159 of undoped $Al_{x2}Ga_{1-x2}As$ which forms the collector of the PHFET device 111 and is about 0.5 µm in thickness. All of the layers grown thus far form the PHFET device 111 with the gate contact on the bottom. The layers between the P+ AlGaAs layer 1155c and the last undoped GaAs barrier layer 1158 correspond to the p-type modulation doped heterojunction QW structure 120 of FIG. 3. Undoped AlGaAs layer 1159 corresponds to the undoped spacer layer 122 of FIG. 3.

Layer 1159 also forms the collector region of the NHFET device 113. Deposited on layer 1159 are two layers (collectively 1160) of undoped GaAs of about 200-250 Å total thickness, which form the barrier of the first n-type quantum well. Layer 1160 is thicker than the normal barrier layer of about 100 Å because it accommodates the growth interruption to change the growth temperature from 610° C. (as required for optical quality $Al_{x2}Ga_{1-x2}As$ layers) to about 530° C. for the growth of InGaAs. Therefore layer 1160 includes a single layer 1160a of about 150 Å and a repeating barrier layer 1160b of about 100 Å. The next layer 1161 is the quantum well of $In_{0.2}Ga_{0.8}As$, which is undoped and about 40-80 Å in thickness. It is noted that the n-type quantum well layer 1161 need not be of the same formulation as the p-type quantum well layer 1157. The barrier layer 1160b of 100 Å and quantum well layer 1161 may be repeated, e.g., three times. Then there is a barrier layer 1162 of about 10-30 Å of undoped GaAs which accommodates a growth interruption and a change of growth temperature. Next there are four layers (collectively 1163) of $Al_{x2}Ga_{1-x2}As$ of about 300-500 Å total thickness. These four layers (1163) include a spacer layer 1163a of undoped $Al_{x2}Ga_{1-x2}As$ that is about 20-30 Å thick, a modulation doped layer 1163b of N+ type doping of $Al_{x2}Ga_{1-x2}As$ (with doping about $3.5 \times 10^{18}$ cm$^{-3}$) that is about 80 Å thick, a capacitor spacing layer 1163c of undoped $Al_{x2}Ga_{1-x2}As$ that is about 200-300 Å thick, and a P+ type delta doped layer 1163d of $Al_{x2}Ga_{1-x2}As$ (with doping about $3.5 \times 10^{18}$ cm$^{-3}$) that is about 60-80 Å to form the top plate of the capacitor. The doping species for layer 1163d is preferably carbon (C) to ensure diffusive stability. In contrast to layer 1163b which is always depleted, layer 1163d should never be totally depleted in operation. Layers 1163d and 1163b form the two plates of a parallel plate capacitor which forms the field-effect input to all active devices. For the optoelectronic device operation, layer 1163 is the upper SCH region. Layer 1163 must be thin to enable very high frequency operation. In the illustrated embodiment, for a transistor cutoff frequency of 40 GHz, a thickness of 300 Å would be used, and for 90 GHz a thickness of 200 Å would be more appropriate. The layers between the undoped GaAs barrier layer 1160a and the N+ AlGaAs layer 1163b correspond to the n-type modulation doped heterojunction QW structure 124 of FIG. 3. Undoped AlGaAs layer 1163c corresponds to the undoped spacer layer 126 of FIG. 3.

One or more layers (collectively 1164) of p-type $Al_{x1}Ga_{1-x1}As$ are deposited next to form part of the upper waveguide cladding for the laser, amplifier and modulator devices. A majority of the upper waveguide cladding for waves propagating in the guide formed by the optically active region of the device is provided by the top dielectric mirror itself. The top dielectric mirror causes the light to be guided partially as a dielectric waveguide and partially as a mirror waveguide. Layer 1164 has a typical thickness of 500-1500 Å. Layer 1164 may have a first thin sublayer 1164a of, e.g., 10-20 Å thickness and having a P+ typical doping of 1019 cm −3. A second sublayer 1164b has a P doping of $1 \times 10^{17}$-$5 \times 10^{17}$ cm$^{-3}$ and a typical thickness of 700 Å. The parameter x1 of layer 1164 is preferably about 70%. The p-type layers 1163b, 1164A, 1164B correspond to the p-type layer(s) 128 of FIG. 3. Deposited next is an ohmic contact layer 1165 (which may comprise a single layer of GaAs or a combination of GaAs (1165a) and InGaAs (1165b) as shown), which is about 50-100 Å thick and doped to a very high level of P+ type doping (about $1 \times 10^{20}$ cm$^{-3}$) to enable the best possible ohmic contact.

Alternatively, the active device structure may be described as a pair of stacked quantum-well-base bipolar transistors formed on the bottom DBR mirror (layers 1151/1152). The first of these is an n-type quantum-well-base bipolar transistor (comprising layers 1153 through 1159) which has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 1159 through 1165b) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure.

Figure 8B:
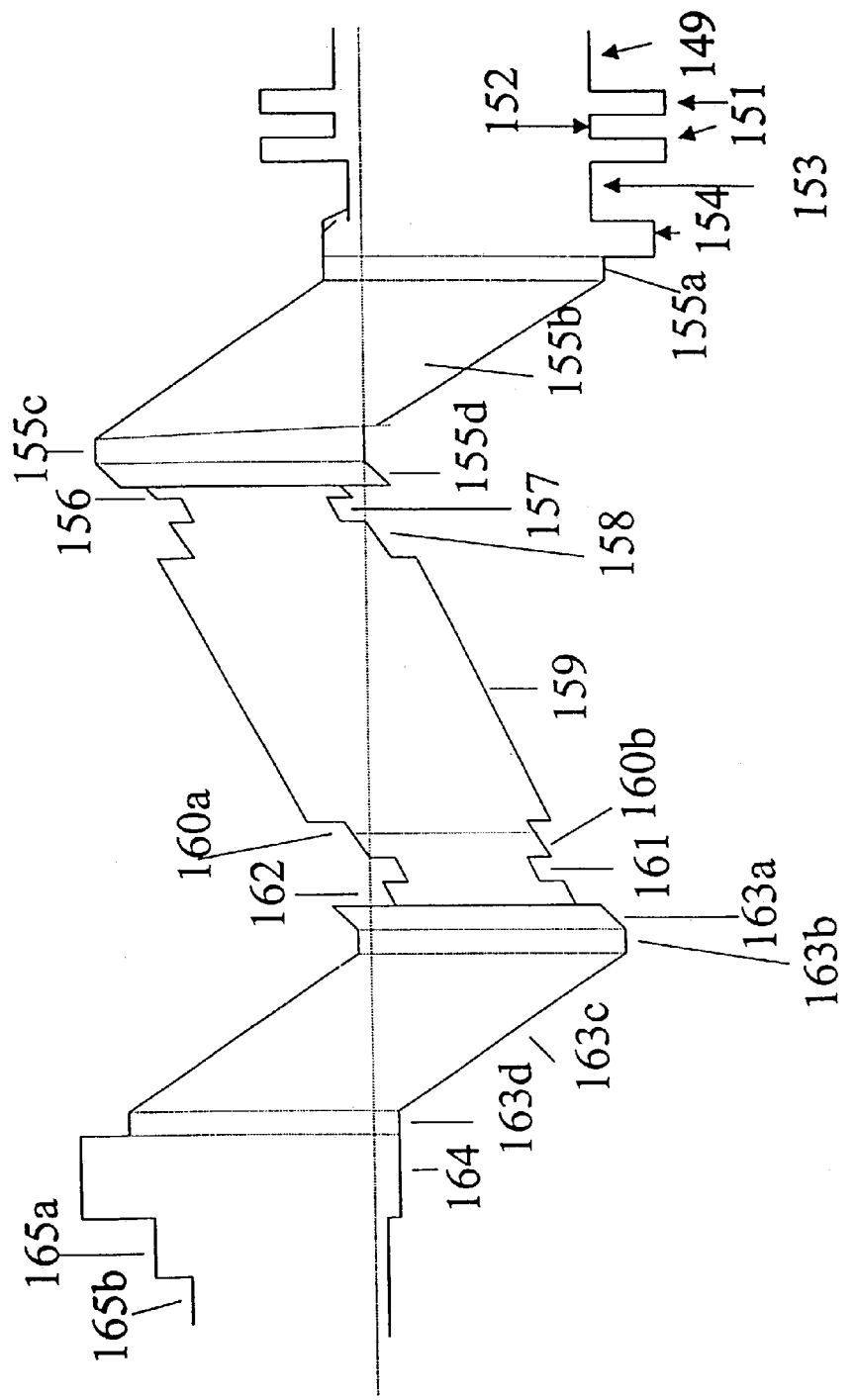
FIG. 8B shows the energy band diagram of the structure of FIG. 8A.

The band diagram of the FIG. 8A structure is shown in FIG. 8B.

To form a resonant cavity device where light is input into and emitted from the device laterally (i.e., from a direction normal to the cross section of FIG. 8A), a diffraction grating (for example, as described in detail in U.S. Pat. No. 6,031,243) and top dielectric mirror are formed over the active device structure described above. For vertical cavity lasing devices, the diffraction grating performs the function of diffracting light produced by the vertical cavity into light propagating laterally in a waveguide which has the top dielectric mirror and bottom DBR mirror as waveguide cladding layers and which has lateral confinement regions (typically formed by implants as described herein in more detail). For vertical cavity detecting devices, the diffraction grating performs the function of diffracting incident light that is propagating in the lateral direction into the vertical cavity mode, where it is absorbed resonantly in the vertical cavity. The distance between the top dielectric mirror and bottom DBR mirror preferably represents an integral number of ½ wavelengths at the designated wavelength. Preferably, the thickness of layer 1164 or 1159 is adjusted to enable this condition. The structure of FIGS. 8A and 8B may be used to realize various optoelectronic devices, including a heterojunction thyristor device that are configured to operate as a detector/emitter, optical modulator, amplifier, etc), an array of transistor devices (including n-channel HFET devices, p-channel HFET devices, n-type quantum-well-base bipolar transistors and p-type quantum-well-base bipolar transistors), and waveguide devices.

Figure 9:
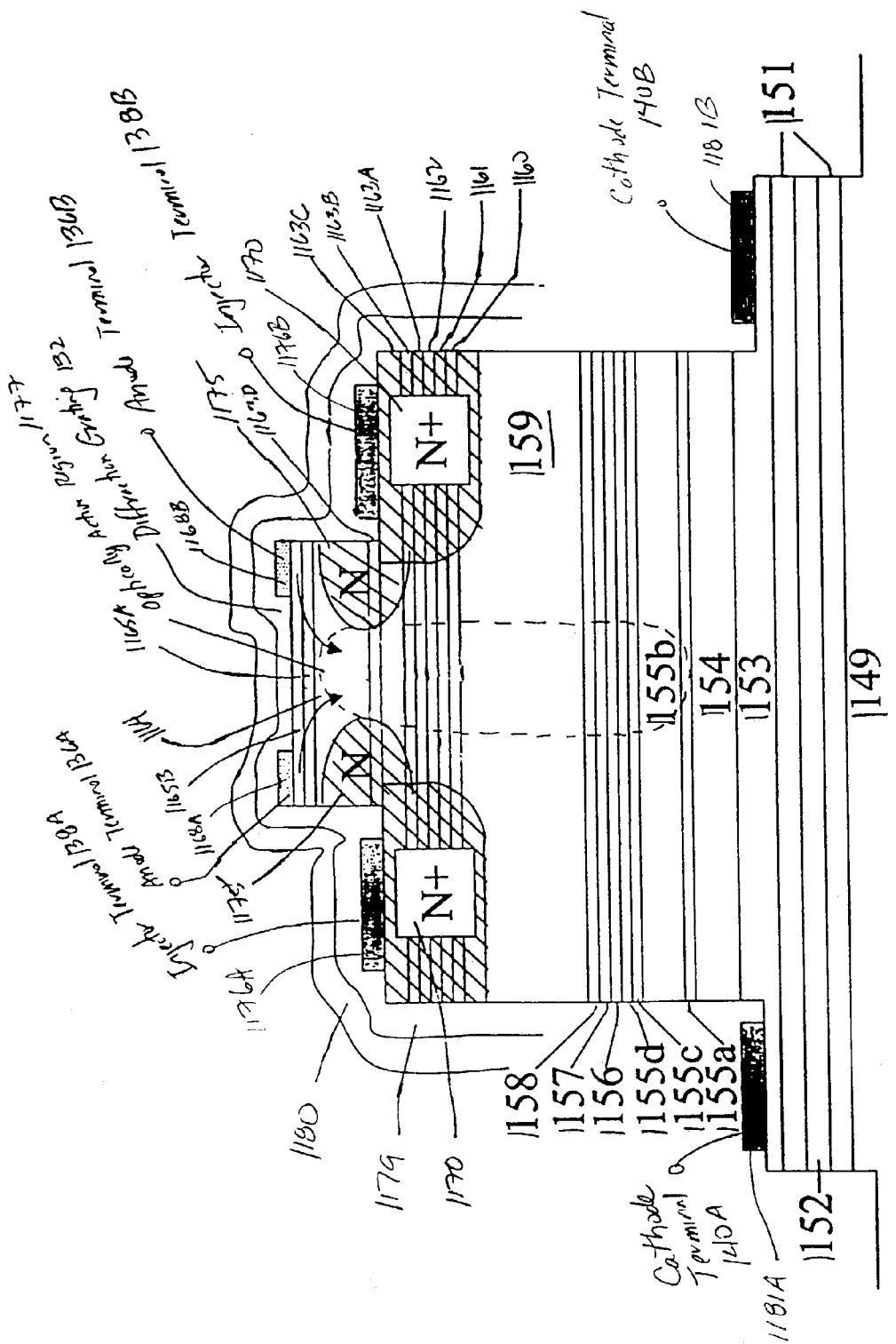
FIG. 9 is a cross-sectional schematic view showing the generalized construction of an exemplary heterojunction thyristor formed from the inversion quantum-well channel layer structure of FIG. 8A.

FIG. 9 illustrates an exemplary heterojunction thyristor device realized from the multilayer sandwich of FIGS. 8A and 8B. To connect to the anode terminals 136A, 136B of the device, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Preferably, this dielectric layer also forms the first layer of the top DBR mirror. Then an ion implant 1175 of n-type is performed using a photomask that is aligned to the alignments marks, and an optical aperture is defined by the separation between the implants 1175. The implants 1175 create a p-n junction in the layers between the n-type quantum well(s) and the surface, and the aperture between the implants defines the region in which the current may flow, and therefore the optically active region 1177 as shown. The current cannot flow into the n-type implanted regions 1175 because of the barrier to current injection. The current flow trajectory is shown in FIG. 9 as arrows. For lasing applications, the laser threshold condition is reached before the voltage for turn-on of this barrier. Following the implant 1175, a metal layer 1168 (preferably comprising tungsten) is deposited and defined to form two parts 1168A, 1168B to thereby form anode terminals 136A and 136B (which collectively form the anode terminal 136) of the device.

Then an ion implant 1170 of n+-type is performed using the metal layer 1174 as a mask that is self-aligned to the metal features, to thereby form contacts to the n-type QW inversion channel(s). During this operation, an etchant is used to forms mesas at (or near) the undoped AlGaAs layer 1163c. The resulting mesas are subject to the N+ ion implants 170, which contact the n-type QW inversion channel(s). Similar implant operations may be used to form p+-type implants that form contacts to the p-type QW inversion channel(s), if need be.

Connection to the cathode terminal (e.g., N+ layer 1153) of the device is made by etching down to the contact layer 1153 to form resulting mesas in the contact layer 1153. Next the device is subjected to a rapid thermal anneal (RTA) of the order of 900° C. or greater to activate all implants. Then the device is isolated from other devices by an etch down to the semi-insulating substrate 1149, which includes an etch through the mirror pairs 1151/1152 of AlAs/GaAs. At this point, the device is oxidized in a steam ambient to create layers 1179/1180, which form the top dielectric mirror. During this oxidation step, the exposed sidewalls of the etched AlGaAs layers are passivated by the formation of very thin layers of oxide. The final step in the fabrication is the deposition (preferably via lift off) of metal contacts. These contacts come in three forms. The first type includes contacts 1176A, 1176B (preferably comprising an n-type Au alloy metal such as AuGe/Ni/Au) that are deposited on the N+ type implants 1170 and defined to form the N-channel injector terminal electrodes 138A, 138B. The second type include contacts 1181A, 1181B (preferably comprising an n-type Au alloy metal such as AuGe/Ni/Au) that are deposited on the mesas at the N+ layer 153 and defined to form the cathode terminal electrodes 140A, 140B of the device. The third type is the metal layer 1178 (not shown), which preferably comprises a p-type Au metal alloy such as AuZn/Cr/Au, that is deposited on the P+ type implant (which is coupled to the p-type QW channel) and defined to form the p-channel injector terminal electrodes, if need be.

To form a device suitable for in-plane optical injection into a resonant vertical cavity and/or in-plane optical emission from the resonant vertical cavity, a diffraction grating 132 (for example, as described in detail in U.S. Pat. No. 6,031,243) and the top dielectric mirror is formed in conjunction with the active device structure as described above. The top dielectric mirror is preferably created by the deposition of one or more dielectric layer pairs (1179, 1180), which typically comprise $SiO_2$ and a high refractive index material such as GaAs, Si, or GaN.

Figure 10A:
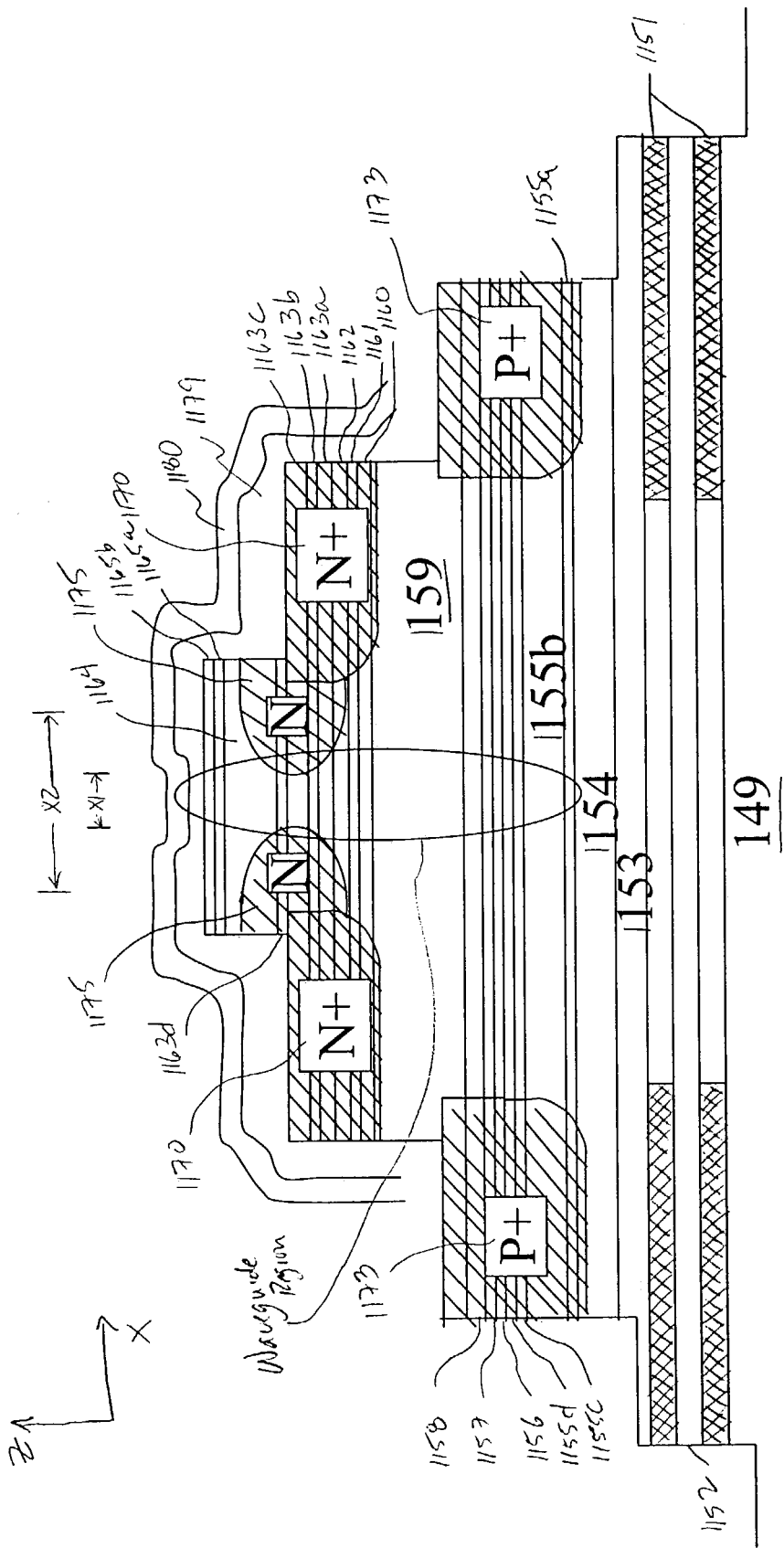
FIG. 10A is a cross-sectional schematic view showing the generalized construction of an exemplary in-plane waveguide formed from the inversion quantum-well channel layer structure of FIG. 8A.

FIG. 10A illustrates an exemplary in-plane passive waveguide device realized from the multilayer sandwich of FIGS. 8A and 8B. The device includes an elliptical waveguide region (e.g., mode) that extends laterally (i.e., in a perpendicular to the cross-section) and that extends vertically down through the structure to include both the n-type QW channel structure (layers 1160a through 1163b) and the p-type QW channel structure (layers 1155c through 1158). Similar to the process steps for fabricating the heterojunction thyristor device as described above with respect to FIG. 9, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. Preferably, this dielectric layer also forms the first layer of the top dielectric mirror. Then an ion implant 1175 of n-type is performed using a photomask that is aligned to the alignments marks, and an optical aperture is defined by the separation between the implants 1175. Importantly, the implants 1175 provide optical confinement in the waveguide region shown.

Following the implants 1175, photolithography and etching is used to etch away the dielectric layer and the p-type contact layers 1165b and 1165b in a waveguide area that covers the optical aperture. The waveguide area has a lateral dimension X2 as shown. Note that this waveguide area covers the optical aperture, whose lateral dimension X1 is defined by the separation of the implants 1175 as shown. An oxide layer (e.g., $SiO_2$) is deposited to cover the waveguide area. The next step is a rapid thermal annealing operation. In this step, implants 1175 are activated and the regions covered with oxide layer experience Impurity Free Vacancy Disordering (IFVD) which increases the bandgap locally to substantially eliminate absorption, thereby forming the waveguide region as shown. Note that the regions that remain covered with dielectric layer show essentially no effects of IFVD.

Ion implantation of n+-type ion 1170 in addition to photolithography and etching are used to form mesas at (or near) the undoped AlGaAs layer 1163c. Similarly, ion implantation of p+-type ions in addition to photolithography and etching operations are used to form additional mesas at (or near) the undoped AlGaAs layer 1159 to thereby form a staircase in the multilayer structure as shown. The device is then isolated from other devices by photolithography and etching down to the semi-insulating substrate 1149, which includes an etch through the mirror pairs 1151/1152 of AlAs/GaAs. At this point, the device is oxidized in a steam ambient to create one or more dielectric layer pairs (1179, 1180), which typically comprise $SiO_2$ and a high refractive index material such as GaAs, Si, or GaN. These layer pairs 1179/1180 form the top dielectric mirror. During this oxidation step, the exposed sidewalls of the etched AlAs layers 1151 are passivated by the formation of very thin layers of oxide, which are depicted as shaded regions in layers 1151.

The final waveguide is a double ridge structure in which a shallow rib defines the internal core dimension and a much larger rib defines the outer extremities of the guide. By design very little of the optical energy will penetrate to the external boundaries. The main guiding action is achieved by the presence of the implanted regions 1175 in addition to the presence of the oxidized $Al_xO_y$ sections (depicted as crosshatched regions in layer 1151) produced by lateral oxidation during the oxidation procedure as discussed above.

The width of the mesas of the waveguide may be adjusted to achieve the lowest possible optical loss for straight propagation and the lowest possible bend loss. Moreover, any of these mesas may be eliminated in a given design. Alternatively, one or more of the mesas may be enlarged on one side and reduced or eliminated on the other side to achieve an optimum bend radius. In addition, layers of polyimide (for interlevel dielectric purposes) and the dielectric mirror layers 1179/1180 may be deposited over the mesa edges to provide additional cladding and confinement to improve the guiding. With this combination of features, low loss straight propagation and also very sharp waveguide bends with acceptable bend loss can be achieved.

In the preferred waveguide design as illustrated in the plan view of FIG. 10B, the waveguide structure 1201 is self-aligned to an active device 1202 at the port 1203 (which may be an input optical port or output optical port) of the active device 1202, which typically has a cross-section on the order of 1 μm by 1 μm. At the edge 1205 of the optoelectronic integrated circuit 1204, the waveguide structure 1201 couples to a fiber 1207, which typically has an 8 μm diameter core 1209. Therefore between the active device 1202 and the fiber 1207, the waveguide structure 1201 must be expanded in both the lateral dimension (the X dimension shown in FIGS. 10A and 10B) and the vertical dimension (the Z dimension in FIG. 10A) in order to optimize the coupling.

To expand the lateral dimension of the waveguide structure 1201, the widths of the mesas of the waveguide structure are flared out (tapered) so that the lateral dimension of the waveguide region matches the dimension of the core 1209. The taper is performed over a distance such that the mode expands adiabatically, which means minimum optical loss. It must be expanded to achieve minimum loss and also to remain single mode. To achieve this, the vertical dimension of the waveguide region must also be expanded to achieve an approximately circular mode as described next.

Adjustment of the vertical dimension of the waveguide region is controlled by the width of the mesa formed by the trench etch through the mirror pairs 1151/1152. This trench etch pattern sets the distance that the oxide must penetrate to extend completely under the guide. As the edges of the outer mesa surface (labeled 1211A and 1211B) pull away from the edges of inner mesa surfaces (labeled 1213A and 1213B), the oxide can no longer extend under the entire guide. This occurs both because the oxidation is performed for a specific time at a specific rate and because the rate decreases with distance and the distance eventually saturates. When the oxide extends under the entire guide, the confinement is strong and the mode is confined to the active device crosssection (e.g., on the order of 1 um). When the oxide is absent, the guiding is weak and mode extends down into the substrate. In this manner, the distance from the active device 1202 to the chip edge 1205 can be controlled such so that the mode achieves a penetration into the substrate to produce an effective circular mode (e.g., on the order of 8 μm diameter) and thus optimize the coupling into the fiber. Advantageously, these features simplify the design of the fiber interconnect because it does not need to interface to such a small waveguide channel and thus provides for more efficient optical coupling and lower insertion loss.

Figure 11:
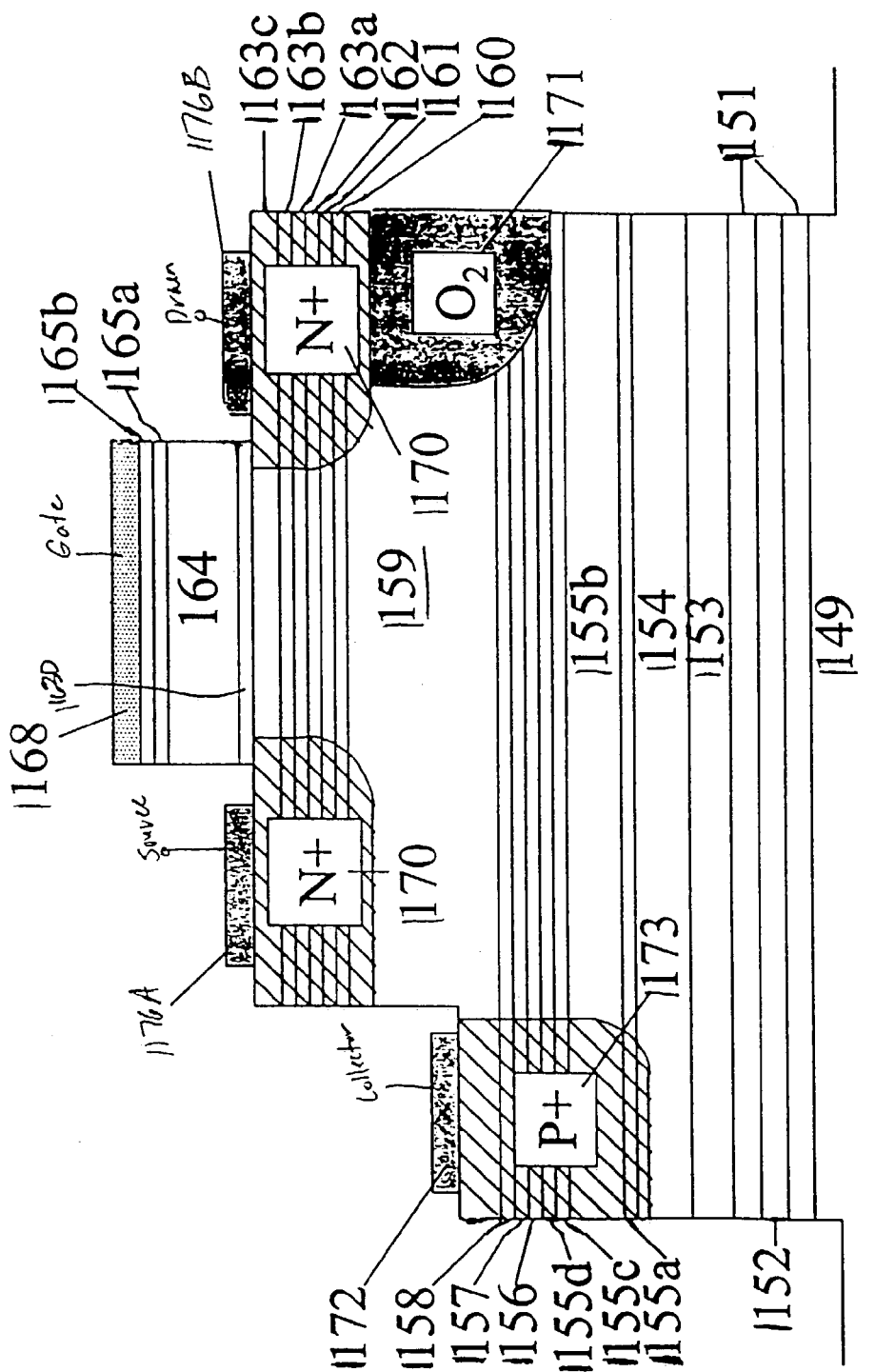
FIG. 11 is a cross-sectional schematic view showing the generalized construction of an exemplary HFET device formed from the inversion quantum-well channel layer structure of FIG. 8A.

FIG. 11 illustrates an exemplary n-channel HFET device realized from the multilayer sandwich of FIGS. 8A and 8B, which is suitable for implementing the bias load resistance 120 and transistors that make up the transistor logic block 36 of the OEIC of FIG. 1. An ohmic metal gate electrode 1168 is deposited on P+ ohmic contact layer 1165b. The structure outside the gate electrode 1168 is etched down to near (for example, to layer 1163c) the n-type QW channel consisting of the layers 1161 and 1160. An ion implant 1170 of n-type ions forms a self-aligned contacts to the n-type QW channel. On the source side of the NHFET, the resulting structure is etched down near (for example, to layer 1159 at a point about 1000 Å above) the p-type QW structure 1157. An ion implant 1173 of p-type ions is performed to contact the p-type QW inversion channel. Also an insulating implant 1171 (utilizing, for example, oxygen as shown) is performed under the n-type ion implant for the drain to reduce the capacitance for high speed operation. An insulating implant (not shown) may also be performed under the p+-type implant 1173 for this same purpose. Next the device is subjected to a rapid thermal anneal (RTA) of the order of 900° C. or greater to activate all implants. Then the device is isolated from other devices by an etch down to the semi-insulating substrate 1149, which includes an etch through the mirror pairs 1151/1152 of AlAs/GaAs. At this point, the device is oxidized in a steam ambient to create layers of AlO/GaAs (not shown), which form the top dielectric mirror and which are not part of the active layers of this device). During this oxidation step, the exposed sidewalls of the etched AlGaAs layers are passivated by the formation of very thin layers of oxide. The final step in the fabrication is the deposition (preferably via lift off) of Au metal contacts. These contacts come in two forms. The first type includes contacts 1176A, 1176B (preferably comprising an n-type Au alloy metal such as AuGe/Ni/Au) that are deposited on the N+ type implants 1170 and defined to form the source and drain electrodes of the n-type HFET device. The second type is contact layer 1172 (preferably comprising a p-type Au metal alloy such as AuZn/Cr/Au) that is deposited on the P+ type implant 1173 and defined to form the collector electrode of the device.

Figure 12:
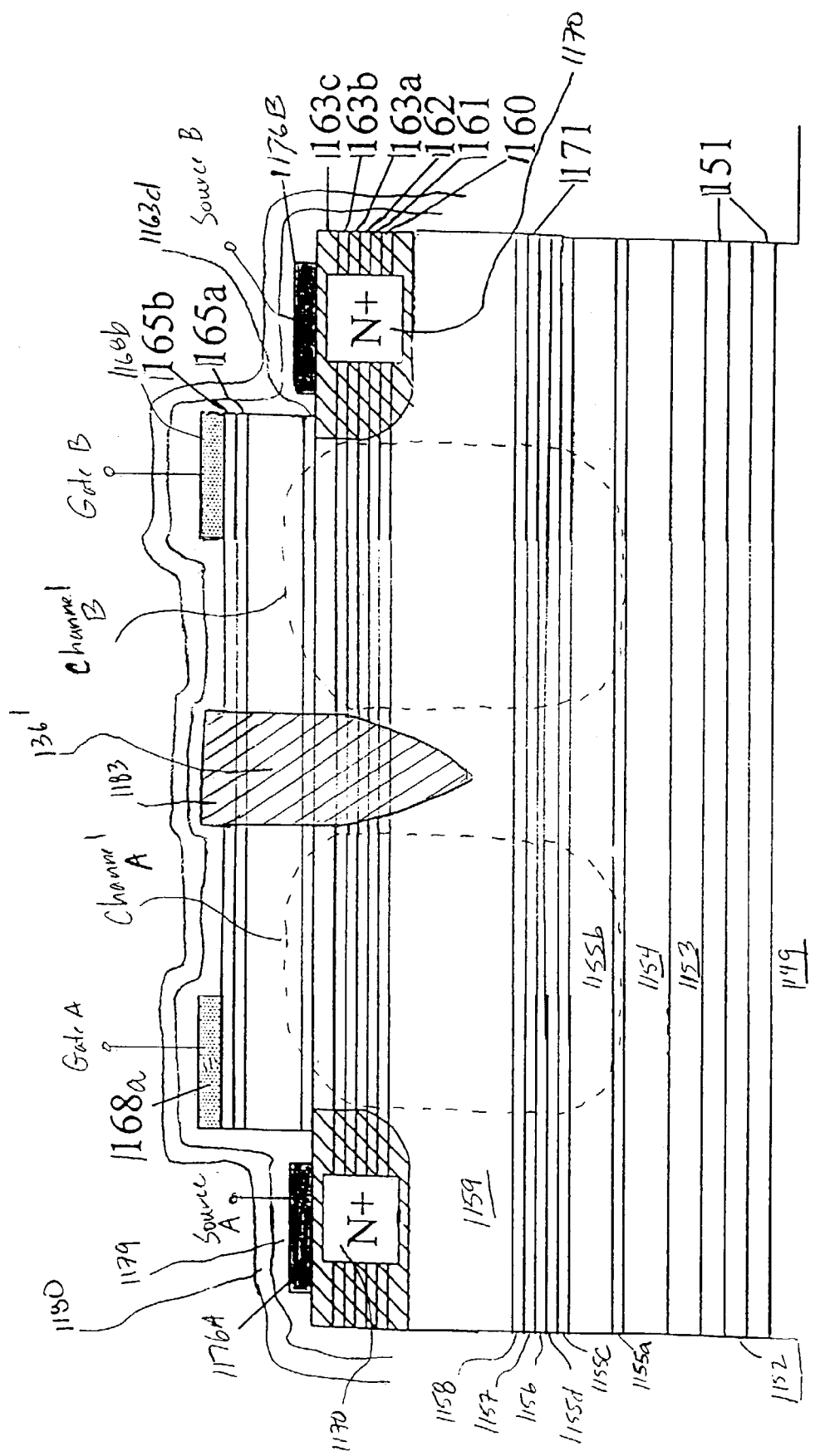
FIG. 12 is a cross-sectional schematic view showing the generalized construction of an exemplary directional coupler device formed from the inversion quantum-well channel layer structure of FIG. 9A.

FIG. 12 illustrates an exemplary implementation of a directional coupler device realized in the multilayer sandwich of FIGS. 8A and 8B. The device includes two elliptical waveguide structures that form the two channels A and B of the device as shown. The modes of these elliptical waveguide structures extend laterally (i.e., perpendicular to the cross-section) and extend down through the structure to include both the n-type QW channel structure (layers 1160a through 1163b) and the p-type QW channel structure (layers 1155c through 1158). To connect to the gate A terminal and Gate B terminal of the coupler device, alignment marks (not shown) are defined by etching, and then a layer of $Si_3N_4$ or $Al_2O_3$ or other suitable dielectric material (not shown) is deposited to act as protection for the surface layer and as a blocking layer for subsequent ion implants. Preferably, this dielectric layer also forms the first layer of the top DBR mirror. Then, a metal layer 1168 (preferably comprising tungsten) is deposited and defined to form the gate terminal for channel A (labeled 1168a) and the gate terminal for channel B (labeled 1168b).

Then an ion implant 1170 of n+-type is performed using the metal layer 1174 as a mask that is self-aligned to the metal features, to thereby form contacts to the n-type QW inversion channel(s). During this operation, an etchant is used to forms mesas at (or near) the undoped AlGaAs layer 1163c. The resulting mesas are subject to the N+ ion implants 1170, which contact the n-type QW inversion channel(s).

The P+ contact layer 1165B is selectively removed to electrically decouple the gate terminal electrodes for the two channels A and B (1168A, 1168B). This is accomplished by photolithography and etching that extends laterally between the two waveguide channel regions A and B and that extends down through dielectric layer (not shown) and the P+ contact layer 1165b. This forms a window region that extends down through the P+ contact layer 1165b. A narrow passive region (labeled 136¢) that separates the two channels A and B is then formed using impurity free vacancy disordering (IFVD). More specifically, an oxide layer 1183 (e.g., $SiO_2$) is deposited such that it covers the window region.

The next step is a rapid thermal annealing operation. In this step, the implants are activated and the window region covered with the oxide layer 1183 experiences Impurity Free Vacancy Disordering (IFVD). Note that the regions outside the window and covered with the dielectric layer show essentially no effects of IFVD. Such vacancy disordering produces a disorder region 136' that blocks the flow of charge between the n-type QW channels A and B due to the increased band gap in this region. Advantageously, this process allows the passive region 136' to be very narrow (on the order of 1 μm). This allows the two channels A and B to be located in close proximity to one another, which provides improved evanescent coupling strength. This improved evanescent coupling strength enables the evanescent transfer between channels to take place over a much shorter distance, thereby enabling smaller devices and improved integration capabilities with other HFET coupling devices, HFET logic devices or other electronic and/or optoelectronic devices.

The device is then isolated from other devices by an etch down to the semi-insulating substrate 1149, which includes an etch through the mirror pairs 1151/1152 of AlAs/GaAs. At this point, the device is oxidized in a steam ambient to create layers 1179/1180, which form the top dielectric mirror. During this oxidation step, the exposed sidewalls of the etched AlGaAs layers are passivated by the formation of very thin layers of oxide. The final step in the fabrication is the deposition (preferably via lift off) of metal contacts. The metal contacts include contacts 1176A, 1176B (preferably comprising an n-type Au alloy metal such as AuGe/Ni/Au) that are deposited on the N+ type implants 1170 and defined to form the source A electrode and source B electrode of the directional coupler device.

The directional coupler device of FIG. 12 operates as a beta coupler switching device as illustrated in the plan view shown in FIGS. 7B1 and 7B2. Note that there are two elliptical modes, corresponding to the two channels A and B of the device. When a sufficient positive forward bias is applied between the gate terminal and the source terminal of one channel such that gate conduction injects charge into only the one channel and not the other channel (e.g., by applying a sufficient positive forward bias between the gate terminal and the source terminal of channel A such that gate conduction injects charge into only channel A and not into channel B), there is a change introduced between the relative propagation constants of the two channels A and B. By varying the propagation constant of the two channels A and B, the number of evanescent couplings within the length of the device can be controlled. When one evanescent coupling occurs during the length of the device, the optical mode in channel A crosses over to channel B (labeled "AB" in FIG. 7B1), and the optical mode in channel B crosses over to channel A (labeled "BA" in FIG. 7B2). However, when two evanescent couplings occur during the length of the device, the mode in channel A remains in channel A (labeled "AA" in FIG. 7B1), and the mode in channel B remains in channel B (labeled "BB" in FIG. 7B2). In this manner, the control signals supplied to the directional coupler controls the optical path of the optical signal passing through the device whereby the input optical signal (which may be provided at channel-A input or the channel-B input) is selectively output to either the channel-A output or channel-B output in response to these control signals. Exemplary voltage levels for realizing the switching modes shown in FIGS. 7B1 and 7B2 are shown in the table below:

| Input Channel | Output Channel | Gate A Bias Voltage (volts) | Source A Bias Voltage (volts) | Gate B Bias Voltage (volts) | Source B Bias Voltage (volts) |
|---|---|---|---|---|---|
| A | A | 1.6 | 0 | 0 | 1.6 |
| A | B | 0 | 1.6 | 0 | 1.6 |
| B | A | 0 | 1.6 | 0 | 1.6 |
| B | B | 1.6 | 0 | 0 | 1.6 |

Preferably, these control are provided by HFET transistor logic block 36 integrated with the directional coupler device as best shown in FIG. 1. By this means, it is possible to provide integrated logic circuits which can perform the decode function on a digital word. Therefore the capability offered by the technology is the integration of very small (on the order of 100-300 μm in length) directional couplers interfacing to on-chip passive waveguides and integrated together with other optoelectronic devices and electronic devices. In addition, such means provides for controllable optical delays in a range between 50 nanoseconds and 5 picoseconds, which enables generation of accurate high frequency clock signals between 10 Gbps and 200 Gbps.

There have been described and illustrated herein several embodiments of an optoelectronic integrated circuit that utilizes one or more heterojunction thyristor devices and an integral optical feedback path to generate an optoelectronic clock signal suitable for high frequency applications. While particular embodiments of the invention have been described, it is not intended that the invention be limited thereto, as it is intended that the invention be as broad in scope as the art will allow and that the specification be read likewise. Thus, while particular group III-V heterostructures have been disclosed, it will be appreciated that other heterostructures (such as strained silicon-germanium (SiGe) heterostructures) can be used to realize the heterojunction thyristor devices, other active devices and the passive described herein. It will therefore be appreciated by those skilled in the art that yet other modifications could be made to the provided invention without deviating from its spirit and scope as claimed.

What is claimed is:

1. An optoelectronic pulse generator comprising:
    a thyristor detector/emitter device having a thyristor structure formed in a resonant cavity on a substrate, an input port and an output port, the thyristor structure having four regions of changing conductivity type and an active region with at least one quantum well, the thyristor structure adapted to detect an input optical pulse supplied to said input port and to produce an output optical pulse via laser emission in response to the detected input optical pulse, said output optical pulse output via said output port; and
    an optical feedback path, operably coupled between said output port and said input port, that supplies at least a portion of said output optical pulse produced by said thyristor detector/emitter device to said input port, thereby causing said thyristor detector/emitter device to produce a sequence of output optical pulses.

2. An optoelectronic pulse generator according to claim 1, wherein:
    said thyristor structure produces a sequence of output electrical pulses corresponding to said sequence of output optical pulses.

3. An optoelectronic pulse generator according to claim 1, wherein:
    said optical feedback path comprises a programmable optical delay line having a variable optical path length.

4. An optoelectronic pulse generator according to claim 3, wherein:
    said programmable optical delay line includes a network of in-plane waveguide structures and directional coupler devices.

5. An optoelectronic pulse generator according to claim 4, wherein:
    said programmable optical delay line includes a plurality of digital optical modulators that minimize crosstalk produced during operation of said directional coupler devices.

6. An optoelectronic pulse generator according to claim 4, wherein:
    said network of in-plane waveguide structures and directional coupler devices are integrally formed therewith on said substrate.

7. An optoelectronic pulse generator according to claim 6, further comprising:
    transistor logic that controls operation of said directional couplers, said transistor logic integrally formed on said substrate.

8. An optoelectronic pulse generator according to claim 6, wherein:
    said thyristor structure, in-plane waveguide structures and directional coupler devices are formed from a multilayer structure of group III-V materials.

9. An optoelectronic pulse generator according to claim 6, wherein:
    said thyristor structure comprises a p-channel FET transistor formed on said substrate and an n-channel FET transistor formed atop said p-channel FET transistor.

10. An optoelectronic pulse generator according to claim 9, wherein:
    said p-channel FET transistor comprises a modulation doped p-type quantum well structure, and wherein said n-channel FET transistor comprises a modulation doped n-type quantum well structure.

11. An optoelectronic pulse generator according to claim 3, wherein:
said programmable optical delay line includes at least one optical amplifier.

12. An optoelectronic pulse generator according to claim 3, wherein:
said programmable optical delay line includes an optical splitter that generates a an optical signal corresponding to said sequence of output optical pulses produced by said thyristor detector/emitter for output therefrom.

13. An optoelectronic pulse generator according to claim 3, further comprising:
a programmable pulse signal generator that produces a reference electrical pulse signal;
a phase comparator that generates an output signal representing a phase difference between a first clock signal derived from said sequence of output electrical pulses produced by said thyristor detector/emitter device and second clock signal derived from said reference electrical pulse signal produced by said programmable pulse generator; and
control logic for controlling said programmable optical delay line based upon said output signal generated by said phase comparator in order to minimize said phase difference to thereby realize a phase lock loop.

14. An optoelectronic pulse generator according to claim 3, wherein:
said sequence of output optical pulses are output at a frequency which is adjusted by controlling said programmable optical delay line to change its optical path length.

15. An optoelectronic pulse generator according to claim 14, wherein:
a sequence of output electrical pulses that correspond to said sequence of output optical pulses are output at a frequency which is adjusted by controlling said programmable optical delay line to change its optical path length.

16. An optoelectronic pulse generator according to claim 3, wherein:
said sequence of output optical pulses have a duty cycle which is controlled by varying a bias current level supplied to an injector terminal of said thyristor detector/emitter device.

17. An optoelectronic pulse generator according to claim 16, wherein:
a sequence of output electrical pulses that correspond to said sequence of output optical pulses have a duty cycle which is controlled by varying a bias current level supplied to an injector terminal of said thyristor detector/emitter device.

18. An optoelectronic pulse generator according to claim 3, wherein:
said sequence of output optical pulses have a duty cycle which is controlled by modulating optical power of pulses provided to said input port of said thyristor detector/emitter device.

19. An optoelectronic pulse generator according to claim 18, wherein:
a sequence of output electrical pulses that correspond to said sequence of output optical pulses have a duty cycle which is controlled by modulating optical power of pulses provided to said input port of said thyristor detector/emitter device.

20. An optoelectronic pulse generator according to claim 1, wherein:
said optical feedback path comprises an optical fiber operably coupled between said input port and said output port.

21. An optoelectronic pulse generator according to claim 1, wherein:
said output port and said input port comprise a common port, and a reflective element redirects optical signals output from said common port back to said common port.

* * * * *